(12) United States Patent
Kim et al.

(10) Patent No.: US 10,755,942 B2
(45) Date of Patent: Aug. 25, 2020

(54) METHOD OF FORMING TOPCOAT FOR PATTERNING

(71) Applicants: Massachusetts Institute of Technology, Cambridge, MA (US); University of Chicago, Chicago, IL (US)

(72) Inventors: Do Han Kim, Melrose, MA (US); Hyo Seon Suh, Woodridge, IL (US); Priya Moni, Worcester, MA (US); Karen K. Gleason, Cambridge, MA (US); Paul Franklin Nealey, Chicago, IL (US)

(73) Assignees: Massachusetts Institute of Technology, Cambridge, MA (US); University of Chicago, Chicago, IL (US)

( * ) Notice: Subject to any disclaimer, the term of this patent is extended or adjusted under 35 U.S.C. 154(b) by 0 days.

(21) Appl. No.: 15/685,609

(22) Filed: Aug. 24, 2017

(65) Prior Publication Data
US 2018/0122648 A1   May 3, 2018

Related U.S. Application Data

(60) Provisional application No. 62/416,299, filed on Nov. 2, 2016.

(51) Int. Cl.
| | | |
|---|---|---|
| *H01L 21/308* | (2006.01) | |
| *C23C 16/46* | (2006.01) | |
| *H01L 21/311* | (2006.01) | |
| *H01L 21/3065* | (2006.01) | |
| *G03F 7/00* | (2006.01) | |
| *H01L 21/02* | (2006.01) | |

(52) U.S. Cl.
CPC .......... *H01L 21/3086* (2013.01); *C23C 16/46* (2013.01); *G03F 7/0002* (2013.01); *H01L 21/3065* (2013.01); *H01L 21/3081* (2013.01); *H01L 21/31144* (2013.01); *H01L 21/0228* (2013.01); *H01L 21/02118* (2013.01); *H01L 21/02178* (2013.01); *H01L 21/02271* (2013.01); *H01L 21/31138* (2013.01)

(58) Field of Classification Search
CPC ...................................................... C23C 16/46
See application file for complete search history.

(56) References Cited

U.S. PATENT DOCUMENTS

2007/0104860 A1* 5/2007 Gleason ............... A61K 9/2077
  427/2.14
2011/0305898 A1* 12/2011 Zhang .................... B32B 27/28
  428/336

(Continued)

*Primary Examiner* — Dah-Wei D. Yuan
*Assistant Examiner* — Kristen A Dagenais-Englehart
(74) *Attorney, Agent, or Firm* — Dana M. Gordon; Foley Hoag LLP

(57) ABSTRACT

Disclosed is a method for the fabrication of polymeric topcoat via initiated chemical vapor deposition (iCVD) or photoinitiated chemical vapor deposition (piCVD) in conjunction with directed self-assembly (DSA) of block copolymers to generate high resolution patterns. A topcoat deposited by iCVD or piCVD allows for conformal, ultra-thin, uniform, pinhole-free coatings. iCVD or piCVD topcoat enables the use of a diversity of block copolymer (BCP) materials for DSA and facilitates the direct and seamless integration of the topcoats for a pattern transfer process.

15 Claims, 17 Drawing Sheets

(56) References Cited

U.S. PATENT DOCUMENTS

| | | | | |
|---|---|---|---|---|
| 2012/0107614 A1* | 5/2012 | Blum | ............... | B05D 5/083 |
| | | | | 428/411.1 |
| 2012/0217220 A1* | 8/2012 | Dobisz | ............... | B82Y 40/00 |
| | | | | 216/41 |
| 2013/0040102 A1* | 2/2013 | Gleason | ............... | B05D 1/62 |
| | | | | 428/141 |
| 2013/0209757 A1* | 8/2013 | Willson | ............... | B82Y 10/00 |
| | | | | 428/195.1 |
| 2013/0230705 A1* | 9/2013 | Nealey | ............... | G03F 7/0002 |
| | | | | 428/201 |
| 2015/0261090 A1* | 9/2015 | Willson | ............... | G03F 7/11 |
| | | | | 430/325 |

\* cited by examiner

METHOD OF FORMING TOPCOAT FOR PATTERNING

RELATED APPLICATIONS

This application claims the benefit of priority to U.S. Provisional Patent Application Ser. No. 62/416,299, filed Nov. 2, 2016.

GOVERNMENT SUPPORT

This invention was made with Government support under Grant No. CMMI-1344891 awarded by the National Science Foundation. The Government has certain rights in the invention.

BACKGROUND

Directed self-assembly is a promising strategy for high-volume cost-effective manufacturing at the nanoscale. Over the past decades, manufacturing techniques have been developed with such remarkable efficiency that it is now possible to engineer complex systems of heterogeneous materials at the scale of a few tens of nanometers to support the every growing market for semiconductors, which exceeded $300 billion in 2010. Further evolution of these techniques, however, is faced with difficult challenges not only in feasibility of implementation at scales of 10 nm and below, but also in prohibitively high capital equipment costs. Materials that self-assemble, on the other hand, spontaneously form nanostructures down to length scales at the molecular scale. The micrometer areas or volumes over which the materials self-assemble with adequate perfection in structure is incommensurate with the macroscopic dimensions of working devices and systems of devices of industrial relevance. Directed Self-Assembly (DSA) refers to the integration of self-assembling materials with traditional manufacturing processes. The key concept of DSA is to take advantage of the self-assembling properties of materials to reach nanoscale dimensions and at the same time meet the constraints of manufacturing. Put another way, DSA enables current manufacturing process capabilities to be enhanced and augmented, providing pathways for true nanomanufacturing at drastically reduced cost.

DSA of block copolymer films on lithographically defined chemically nanopatterned surfaces is an emerging technology that is well-positioned to revolutionize sub 10 nm lithography and the manufacture of integrated circuits and magnetic storage media. See, for example, Nealey, et al., US Patent Application Publication Nos. 2013/0189504 and 2014/0065379 (both of which are incorporated by reference). Block copolymer materials self-assemble to form densely packed features with highly uniform dimensions and shapes in ordered arrays at the scale of 3 to 50 nm. Chemical pre-patterns are defined using traditional lithographic materials and processes such as 193 immersion or electron beam lithography at the scale of 20 to 40 nm. By directing the assembly of block copolymer films on the chemical pre-patterns, the overall resolution of the lithographic process may be increased by three to four-fold or more. This technology can be applied to semiconductors, materials and equipment, and hard drive manufacture. The interest and exponential growth in research activity and expenditure is driven in the semiconductor industry by the prospect of manufacturing future generations of computer chips according to Moore's law without having to invest billions of dollars in new fabrication facilities (i.e., based on extreme ultra violet lithography) that may or may not be able to meet the resolution requirements already being demonstrated by DSA. For example, IBM developed a chip with 7 nm transistors with a silicon-germanium alloy (SiGe). The design was produced using extreme ultraviolet lithography (EUV, =13.5 nm). The chip was faster with higher-capacity and lower power consumption. This chip was lab-scale and highly expensive. For hard drives, block copolymer lithography is the only known technology that is feasible to fabricate nanoimprint masters to manufacture bit patterned media at the required storage densities (at least greater than 2 Terabit/inch$^2$). Currently DSA of poly(styrene-block-methymethacrylate) (PS-b-PMMA) films on lithographically defined chemically nanopatterned surfaces is the primary focus of activity, and the main research objectives revolve around demonstrations that DSA can meet manufacturing requirements related to degrees of perfection, processing latitude, and integration of the technology with existing infrastructure, and device design for use with DSA patterns.

Critical research issues must be addressed in order to push the DSA technology over the tipping point to widespread implementation in nanomanufacturing. A key roadblock is the establishment of proven pathways to realize sub 10 nm resolution, and scaling to 5 nm; the resolution limit of PS-b-PMMA is ~12 nm. Neither the semiconductor industry nor the hard drive industry will implement DSA for a single generation of products. Whereas substantial effort is being expended by many groups to identify block copolymer systems capable of self-assembling into the sub 10 nm regime, technology gaps exist in fundamental and technological understanding as to how those materials may be processed and directed to assemble and continue to meet the constraints of manufacturing. Moreover, little or no work is aimed at developing specialized tools and processes that will be applicable at the ultimate end-of-the-roadmap length scale.

Directed self-assembly of block copolymers uses physical and/or chemical pre-patterns to control the orientation and alignment of block copolymers (e.g., FIG. 1 and FIG. 2). Strongly segregating block copolymers (high Flory-Huggins parameter ($\chi$), related to the energy of mixing) can produce higher resolution patterns. The Flory-Huggins parameter also indicates the incompatibility of copolymers. Because such block copolymers typically show large differences in surface energy between the blocks, one block (with lower surface energy) tends to segregate to the free surface of films and precludes the assembly of the desired through-film perpendicularly oriented structures during thermal annealing. The low-surface-energy domain of the block copolymer tends to wet the top surface and disrupt the perpendicular orientation of the block copolymers. A topcoat on the block copolymer can inhibit the disruption of the polymer orientation. In this case, thermodynamically favorable boundary conditions at the top surface of the film can be engineered for directed self-assembly. However, the topcoat material and coating methods are limited. Solution spin-coating usually dissolves block copolymers.

There exists a need to develop alternative sub-10 nm patterning methods. These methods can be used to develop faster devices with higher-capacity and lower power consumption. The methods should be compatible with current manufacturing methods and avoid expensive investment in new fabrication facilities.

SUMMARY

Disclosed is a method for the fabrication of polymeric topcoat via initiated chemical vapor deposition (iCVD) or photoinitiated chemical vapor deposition (piCVD) in conjunction with directed self-assembly (DSA) of block copolymers to generate high resolution patterns. A topcoat deposited by iCVD or piCVD allows for conformal, ultra-thin, uniform, pinhole-free coatings. Combining iCVD or piCVD with DSA enables high-resolution nanoscale patterning.

In one aspect, the present disclosure relates to a method of forming a topcoat on a block copolymer film, comprising the steps of:

(a) heating or irradiating an initiator, thereby producing a gaseous free radical initiator;

(b) contacting the block copolymer film with the gaseous free radical initiator and a gaseous monomer, thereby forming a cross-linked topcoat.

In some embodiments of the methods disclosed herein, the block copolymer film is formed by a method comprising the steps of:

(a) providing a substrate;

(b) forming a lithographically defined physical or chemical pattern on the substrate; and (c) coating the substrate with a block copolymer.

In another aspect, provided herein is an article, comprising a substrate, and a coating on the substrate, wherein the coating comprises a block copolymer film and a topcoat on the block copolymer, wherein the topcoat is deposited by iCVD or piCVD.

In a further aspect, provided herein is a method of forming an inorganic pattern on an article, comprising the steps of:

(a) contacting the article with a gaseous inorganic material;

(b) contacting the article with a counter reactant;

(c) optionally repeating cycles comprising steps (a) and (b);

(d) removing the topcoat of the article by a first reactive ion etching; and (e) removing the remaining polymer of the article by a second reactive ion etching.

In still another aspect, provided herein is a method of forming a pattern on an article, comprising the steps of:

(a) coating the article with a resist;

(b) forming a resist pattern using lithography to form a mask;

(c) removing the topcoat of the article by a first reactive ion etching;

(d) contacting the masked article with a gaseous inorganic material;

(e) contacting the masked article with a counter reactant;

(f) optionally repeating cycles comprising steps (d) and (e);

(g) removing the remaining polymer of the masked article by a second reactive ion etching;

(h) etching the substrate by a third reactive ion etching; and (i) stripping residues from the substrate.

In another aspect, provided herein are iCVD or piCVD topcoats with DSA that create high resolution patterns for data storage, memory circuits, and micro-processors.

BRIEF DESCRIPTION OF THE DRAWINGS

FIG. 12 shows ATR-FTIR spectra of four films prepared according to the sample preparation process depicted in FIG. 9.

FIG. 13 shows ATR-FTIR spectra of four films prepared according to the sample preparation process depicted in FIG. 9.

DETAILED DESCRIPTION

Figure 1:
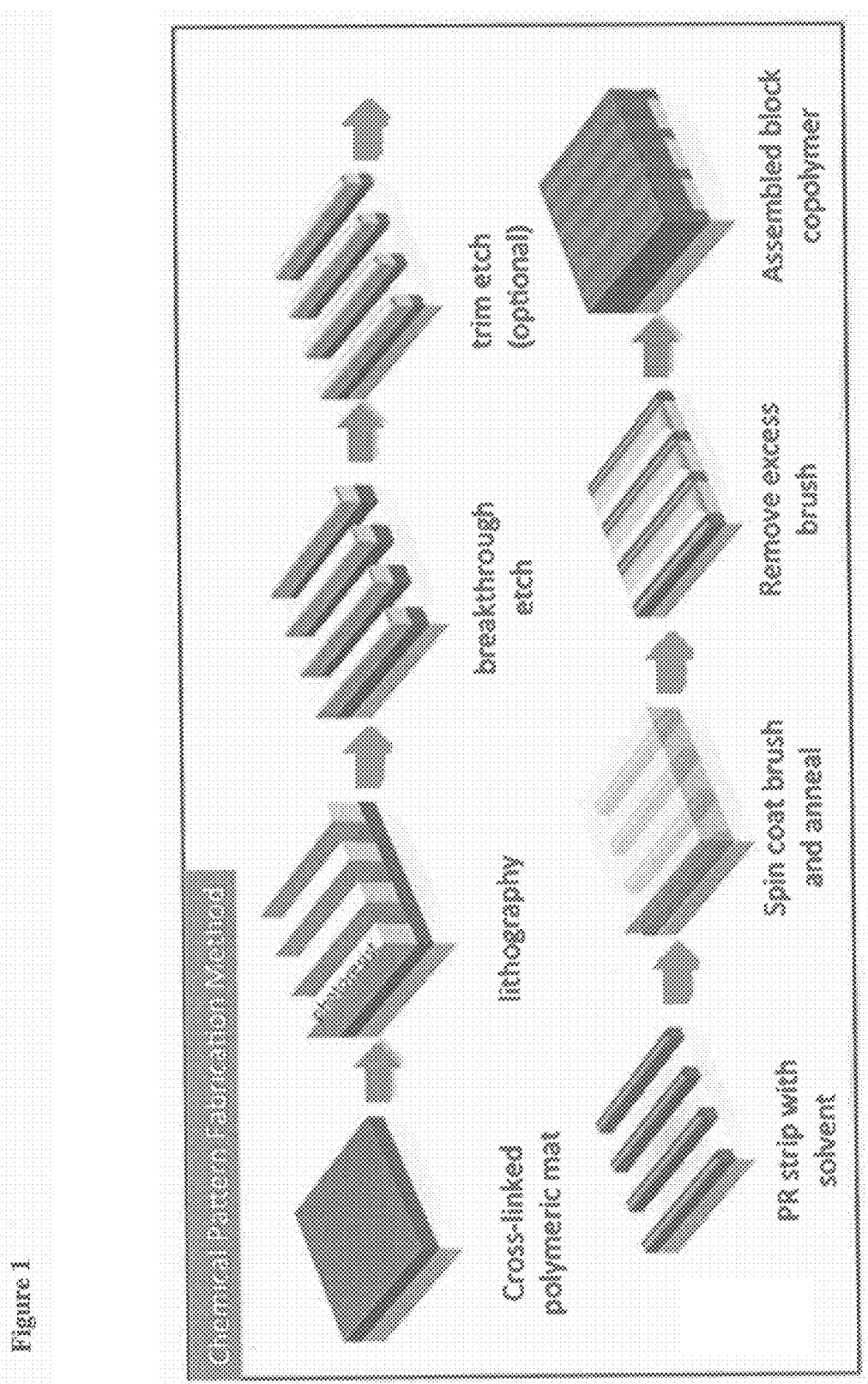
FIG. 1 shows a schematic of a process to create a lithographically defined chemical pattern and for directed self-assembly of a block copolymer film.

Directed self-assembly (DSA) of block copolymers (BCPs) is a strategy for patterning at sub-lithographic resolution in which self-assembling BCPs multiply the density of features in comparison to a lithographically derived template. On chemical patterns generated from 193 nm immersion (193i) photolithography with 84 nm pitch, for example, DSA of polystyrene-block-poly(methyl methacrylate) (PS-b-PMMA) with 28 nm pitch lines and spaces has been demonstrated with extremely low levels of defects, approaching those required for semiconductor manufacturing (0.01/cm$^2$). Unfortunately, PS-b-PMMA has a resolution limit of approximately 11 nm. Therefore, BCPs with $\chi$ (Flory-Huggins interaction parameter) larger than that of PS-b-PMMA were investigated to achieve sub-10 nm features. However, for most BCPs except for PS-b-PMMA, the constituent blocks have considerably dissimilar surface energies, thus precluding facile assembly of perpendicular, through-film domains.

Three general approaches have been developed to circumvent the problem of dissimilar block surface energies: identification or synthesis of high-$\chi$ copolymers with blocks that have equal surface energy, solvent vapor annealing, or the use of topcoat layers to achieve similar interfacial energies in place of disparate surface energies. In the case of topcoats, the design principles of such layers are well understood and recent efforts aim at developing materials and processes that are compatible with high-volume manufacturing. Willson et al. report elegant chemistry that allows for the topcoat to be deposited on organic-soluble BCP films by spin coating from aqueous base, and then washed away after DSA (U.S. Pat. No. 9,157,008 B2, 2015). Potential limitations of this approach include the number of processing steps required and the inability to use with BCPs with blocks that are incompatible with or swell in water and high-$\chi$ BCPs that often contain highly polar constituents. Such incompatibility can be overcome by depositing topcoats from the vapor phase (U.S. Pat. No. 9,040,121 B2, 2015). In both cases, the compositions of topcoats have to be tailored to achieve a non-preferential surface for a specific BCP system. Herein, the use of initiated chemical vapor deposition (iCVD) to deposit a universal topcoat from the vapor phase was investigated. The motivation for pursing an iCVD or a photoinitiated chemical vapor deposition (piCVD) approach includes increasing the diversity of BCP materials that can be used for DSA, and the direct and seamless integration of the ultra-thin topcoat layers into pattern transfer processes.

This disclosure describes the fabrication of polymeric topcoat via iCVD or piCVD in conjunction with directed self-assembly (DSA) of block copolymers to generate high resolution patterns. In certain embodiments, the topcoat polymer used in this disclosure is poly(divinylbenzene) (P(DVB)) and the block copolymers (BCP) include poly(2-vinylpyridine)-block-polystyrene-block-poly(2-vinylpyridine) (P2VP-b-PS-b-P2VP) and poly(styrene-block-methacrylate) (PS-b-PMMA). In the semiconductor industry, the formation of high resolution (<10 nm) patterns is crucial to the improvement of speed, capacity, and power consumption. The DSA with block copolymers and topcoats is a low-cost process to improve current expensive photolithography in cost and pattern resolution. Such a DSA process requires a thin, pinhole-free polymeric topcoat on the BCP which is critical to achieve the high resolution patterns. Also, the topcoat should not damage the BCP layer underneath during the coating process. Moreover, the surface energy should be matched with the BCP and be scalable for manufacturing. The topcoat by iCVD or piCVD, initiated chemical vapor-phase depositions, satisfy these requirements and enables fabrication of multi-scale patterns. Most importantly, the iCVD or piCVD topcoat works with multiple BCPs universally enhancing the graft interface between the topcoat and BCPs.

The planar and chemical patterns with different surface energies toward BCP are first formed on a substrate by electron-beam (e-beam) lithography for control of the alignment of BCP. Then, the BCP is spun-cast on the chemical patterns. The topcoat is deposited on the BCP by iCVD, in which monomer and initiator vapors are introduced into the vacuum chamber and initiator is decomposed into radicals near hot-filaments, suspended above the cool BCP substrate, or piCVD, in which monomer and initiator vapors are introduced into the UV-irradiated chamber. As the monomer vapor adsorbs on the BCP, the radicals initiate the polymerization on the surface growing the topcoat on the BCP. The following thermal annealing induces the aligned and perpendicular structures of the BCP. In practice, for replication of the patterns, converting one domain of the BCP to a metal oxide with an organometallic precursor increases the etching selectivity. Following with several dry etching processes replicates the BCP patterns on the substrate.

The ultra-thin, uniform, and pin-hole free topcoat via solvent-free iCVD or piCVD does not damage or dissolve the BCP layer underneath the topcoat, which is of great importance in successful DSA process. Moreover, the unique and neutral interface (i.e., grafting) formed only by iCVD or piCVD permits a topcoat applicable to multiple BCPs while the solution-based topcoats in the existing publications are customized to specific BCPs. In addition to the high resolution pattern formation, the inert and cross-linked iCVD or piCVD topcoat enables the fabrication of the topcoat patterns through conventional lithography, thereby producing the multi-scale patterns. The iCVD or piCVD topcoat is also readily implemented by current manufacturing processes in industry with no big expense.

Solution-based topcoats require careful design of chemistry for both block copolymer and topcoat to enable a spin on/off process. There can be a solubility issue with block copolymers and solution-based topcoats. In DSA, careful selections of block copolymers and boundary conditions in a given system enable achievement of targeted sizes and features. For block copolymers to form features smaller than 10 nm, the interfaces at both the bottom and the top of block copolymer films should be controlled for desirable morphologies. Most topcoats used with DSA were customized for a specific block copolymer.

The topcoat formed by iCVD or piCVD does not have a solubility issue with block copolymers because the deposition is solvent-free. A topcoat formed by iCVD or piCVD is stable against sequential infiltration synthesis (SIS). This allows pattern transfer because the topcoat does not need to be removed before SIS. A topcoat formed by iCVD or piCVD allows for precise control of thickness and properties of the topcoat. A topcoat formed by iCVD or piCVD is compatible with conventional lithography (e.g., photolithography and e-beam lithography). Multi-patterning can be carried out using an iCVD or piCVD topcoat.

Definitions

For convenience, certain terms employed in the specification, examples, and are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of" will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

For purposes of this disclosure, the chemical elements are identified in accordance with the Periodic Table of the Elements, CAS version, Handbook of Chemistry and Physics, 67th Ed., 1986-87, inside cover.

"BCP" as used herein is an abbreviation for block copolymer.

"DSA" as used herein is an abbreviation for directed self-assembly.

"iCVD" as used herein is an abbreviation for initiated chemical vapor deposition.

"piCVD" as used herein is an abbreviation for photoinitiated chemical vapor deposition.

"SIS" as used herein is an abbreviation for sequential infiltration synthesis.

As used herein, the term "surface" or "surfaces" or "substrates" can mean any surface of any material, including glass, plastics, metals, polymers, paper, fabric and the like. It can include surfaces constructed out of more than one material, including coated surfaces. Importantly, all surfaces/substrates of the disclosure can react with the oxidants/catalysts of the disclosure, resulting in the covalent attachment of the polymer coating to the surface/substrate.

The abbreviations Me, Et, Ph, Tf, Nf, Ts, and Ms represent methyl, ethyl, phenyl, trifluoromethanesulfonyl, nonafluorobutanesulfonyl, p-toluenesulfonyl and methanesulfonyl, respectively. A more comprehensive list of the abbreviations utilized by organic chemists of ordinary skill in the art appears in the first issue of each volume of the *Journal of Organic Chemistry*; this list is typically presented in a table entitled *Standard List of Abbreviations*.

In one aspect, the present disclosure relates to a method of forming a topcoat on a block copolymer film, comprising the steps of:

(a) heating or irradiating an initiator, thereby producing a gaseous free radical initiator;

(b) contacting the block copolymer film with the gaseous free radical initiator and a gaseous monomer, thereby forming a cross-linked topcoat.

In certain embodiments of the methods disclosed herein, the initiator is selected from the group consisting of peroxides, aryl ketones, and azo compounds.

In other embodiments of the methods disclosed herein, the initiator is triethylamine.

In some embodiments of the methods disclosed herein, heating an initiator produces a gaseous free radical initiator using thermal energy. In another embodiment, the initiator is a peroxide or an azo compound. In certain embodiments, the initiator is an azo compound selected from the group consisting of 4,4'-Azobis(4-cyanovaleric acid), 4,4'-Azobis(4- cyanovaleric acid), 1,1'-Azobis(cyclohexanecarbonitrile), 2,2'-Azobis(2-methylpropionamidine) dihydrochloride, 2,2'-Azobis(2-methylpropionitrile), and 2,2'-Azobis(2-methylpropionitrile). In one embodiment, the initiator is 2,2'-Azobis(2-methylpropionitrile). In certain embodiments, the initiator is a peroxide selected from the group consisting of tert-butyl hydroperoxide, tert-butyl peracetate, cumene hydroperoxide, dicumyl peroxide, benzoyl peroxide, tert-amyl peroxide, tert-butyl peroxide, and tert-butyl peroxybenzoate. In another embodiment, the initiator is tert-butyl peroxide.

In other embodiments of the methods disclosed herein, irradiating an initiator (e.g., using UV-light) produces a gaseous free radical initiator. Examples of photoinitiators include, but are not limited to, azobisisobutyronitrile (AIBN), $H_2O_2$ (hydrogen peroxide), ethyl-2,4,6-trimethylbenzoylphenylphosphinate, 2,2'-azobis(2-methylpropane), benzophenone and its derivatives, and Michler's ketone. In one embodiment, the initiator is an aryl ketone.

In certain embodiments of the methods disclosed herein, the monomer is at least one of an acrylate, a siloxane, a silazane, and a vinyl compound. In one embodiment, the monomer is a vinyl compound. In some embodiments, the monomer polymerizes quickly, e.g., is an acrylate. Example monomers include, but are not limited to, methyl methacrylate, butyl acrylate, glycidyl methacrylate, hydroxyl ethyl methacrylate, ethylene glycol diacrylate, acrylates with perfluoro side chains (e.g., 1H,1H,6H,6H-perfluorohexyldiacrylate and 1H,1H,2H,2H-perfluorooctyl acrylate), 2-vinyl pyridine, 4-vinyl pyridine, p-divinylbenzene, m-divinylbenzene, stylene, trivinlytrimethylcyclotrisiloxane, tetravinyltetramethylcyclotetrasiloxane, trivinyltrimethylcyclotrisilazane, and tetravinyltetramethylcyclotetrasilazane. In some embodiments, the monomer is selected from the group consisting of methyl methacrylate, butyl acrylate, glycidal methacrylate, vinyl pyridine, divinylbenzene, stylene, trivinlytrimethylcyclotrisiloxane, tetravinyltetramethylcyclotetrasiloxane, trivinyltrimethylcyclo-trisilazane, and tetravinyltetramethylcyclotetrasilazane. In yet another embodiment, the monomer is divinylbenzene. In yet another embodiment, the topcoat is formed by random copolymerization of extremely hydrophobic monomer 1H,1H,2H,2H-perfluorodecyl acrylate (PFDA) with hydrophilic hydrogel former, hydroxyethyl methacrylate (HEMA). By simply changing the vapor-phase ratio of these comonomers, the mole % PFDA fraction in the film was systematic varied between 0 and 100%, while maintaining a smooth surface morphology. Thus, the surface energy of the iCVD or piCVD random copolymer is readily tuned over a wide range as is desired for controlling the self-assembly of conventionally synthesized block copolymers. In other embodiments, the topcoat is formed using a polymer selected from the group consisting of poly (methyl methacrylate) (PMMA), poly(4-vinylpyridine-co-divinylbenzene), poly-glycidal methacrylate (PGMA), polystyrene-random-benzocylcobutene (PS-r-BCB), poly(2-vinylpyridine)-random-benzocylcobutene (P2VP-r-BCB), and polystyrene-random-poly(2-vinylpyridine)-random-benzocylcobutene (PS-r-P2VP-r-BCB).

In other embodiments, the topcoat is formed by initiated chemical vapor deposition (iCVD) and grafts to the block copolymer during deposition. In some embodiments, the topcoat is formed by photoinitiated chemical vapor deposition (piCVD) and grafts to the block copolymer during deposition. In another embodiment of the methods disclosed herein, the topcoat formed by iCVD or piCVD promotes intermolecular entanglements at the interface with the block copolymer. In still another embodiment of the methods disclosed herein, the topcoat forms a neutral interface with the block copolymer. In yet another embodiment, the thickness of the grafted interface between the topcoat and the block copolymer is about 1 nm to about 10 nm. In still another embodiment, the thickness of the grafted interface between the topcoat and the block copolymer is about 2 nm to about 5 nm. In some embodiments, the grafted interface is removed by reactive ion etching (e.g., breakthrough reactive ion etching).

In yet another embodiment of the methods disclosed herein, the topcoat forms an interface displaying equal preference for both components of a block copolymer. In still another embodiment, the topcoat forms an interface with nearly equal interfacial energies instead of different surface energies. In a further embodiment, the topcoat strongly interacts with both components of a block copolymer. In other embodiments, the topcoat is not strongly preferential to either component of a block copolymer. In another embodiment, the iCVD or piCVD topcoat process traps chains of the block copolymer at the interface, which generates a nearly non-preferential interface for the block copolymer system. In yet another embodiment, the interfaces drive the perpendicular orientation of lamella. In other embodiments, the interfaces drive the perpendicular orientation of the cylinders. In still another embodiment, the iCVD or piCVD topcoat is compatible with different block copolymers.

Previous approaches to chemical vapor deposition, not initiated, methods to form a topcoat varied the interfacial energy by introducing various chemical substituents into the CVD precursor material. In other words, a non-preferential topcoat for one specific block copolymer system can be achieved by the careful composition control of topcoat materials. In contrast, the interfacial energy of "initiated CVD" topcoat is controlled by block copolymer materials graded at the interface during iCVD or piCVD process. Therefore, the same iCVD topcoat is compatible to different block copolymers. Alternatively, the same piCVD topcoat is compatible to different block copolymers.

In another embodiment of the methods disclosed herein, the topcoat forms a neutral interface with the block copolymer. In still another embodiment, fingerprint morphologies are observed with a range of block copolymers. In some embodiments, the block copolymer film is annealed between the neutral substrates modified by random copolymers and iCVD topcoat. In other embodiments, the block copolymer film is annealed between the neutral substrates modified by random copolymers and piCVD topcoat. In yet another embodiment, fingerprint morphologies were formed regardless of the thickness of the block copolymer film.

In other embodiments of the methods disclosed herein, the topcoat is an insoluble polymer. In another embodiment, the topcoat is a highly cross-linked polymer.

In some embodiments of the methods disclosed herein, the topcoat formed by iCVD or piCVD has similar kinetics to the radical polymerization in a bulk liquid phase.

In some embodiments of the methods disclosed herein, the block copolymer film is formed by a method comprising the steps of:
 (a) providing a substrate;
 (b) forming a lithographically defined physical or chemical pattern on the substrate;
 (d) coating the substrate with a block copolymer; and
 (e) annealing the block copolymer to the substrate.

In other embodiments, the substrate is selected from the group consisting of silicon wafer, glass slide, quartz, poly (ethylene terephthalate) (PET) roll, MELINEX®, polyethylenenaphtalate (PEN) roll, TEONEX®, kapton roll, paper roll, polydimethylsiloxane roll, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, GORE-TEX®, MARLEX®, expanded polytetrafluoroethylene (e-PTFE), low density polyethylene (LDPE), high density polyethylene (HDPE), polyimide (PI), and polypropylene (PP). In some embodiments, the substrate is selected from the group consisting of silicon wafer, glass slide, quartz, polyurethane, polyacrylonitrile, polyphenazine, teflon, polyamide resin, GORE-TEX®, MARLEX®, expanded polytetrafluoroethylene (e-PTFE), and polyimide (PI). In one embodiment, the substrate is a silicon wafer. In another embodiment, the substrate is ultra-thin. In yet another embodiment, the substrate comprises a high resolution nanopattern. In still another embodiment, the substrate comprises a high resolution lithographically defined physical or chemical pattern.

In other embodiments, the BCP substrate is coated with a polymer capable of undergoing a cross-linking reaction using an iCVD process. In certain embodiments, the layer of polymer deposited by iCVD contains monomers capable of undergoing a cross-linking reaction. In another embodiment, the monomer is divinylbenzene. In some embodiments, the monomers are styrene and divinylbenzene. In another embodiment, the effective cross-linking density is controlled by the ratio of the styrene to divinylbenzene monomers. This ratio can affect other parameters including the surface energy, rms surface roughness, chemical stability (including subsequent processing steps), and mechanical properties.

In another embodiment, an iCVD process is used to coat the substrate with a layer of polymer from about 5 to about 20 nm in thickness. In still another embodiment, the layer of polymer deposited by iCVD is uniform. In a further embodiment, the layer of polymer deposited by iCVD is ultrathin. In another embodiment, the layer of polymer deposited by iCVD is pinhole-free. Pinholes form when the roughness of the film exceeds its thickness. In other embodiments, the layer of polymer deposited by iCVD is about 1 to about 5 nm in thickness. In some embodiments, a resist pattern using lithography forms a mask on the layer of polymer deposited by iCVD.

In another embodiment, the substrate is exposed to a polymer capable of undergoing a cross-linking reaction. In some embodiments, the polymer capable of undergoing a cross-linking reaction is a styrene or a styrene derivative. In a further embodiment, the polymer capable of undergoing a cross-linking reaction is a pre-cross-linked polymer. In yet another embodiment, the polymer capable of undergoing a cross-linking reaction is a pre-cross-linked polystyrene. In still another embodiment, the pre-cross-linked polystyrene is AZ NLD128.

In certain embodiments, the thickness and uniformity of thickness of a lithographically defined physical or chemical pattern is determined by spin coating. In another embodiment, a lack of uniformity of thickness leads to non-ideal pattern transfer. In yet another embodiment, small differences in etch selectivity leads to non-ideal pattern transfer.

In some embodiments, the physical or chemical pattern formed by photolithography or electron-beam lithography.

In another embodiment, the lithographically defined physical or chemical pattern control the alignment and orientation of the block copolymer. In yet another embodiment, the lithographically defined physical or chemical pattern direct self-assembly of the block copolymer. In still another embodiment, the lithographically defined physical or chemical pattern enable directed self-assembly of the block copolymer based on a high resolution nanopattern. In a further embodiment, the lithographically defined physical or chemical pattern enable directed self-assembly at 10 nm and below.

In yet another embodiment, a trim etch process is used to define the lithographically defined physical or chemical pattern. In still another embodiment, the trim etch process results in structure of about 10 nm. The current technologies for the trim etch process are limited in terms of uniformity of widths and edge roughness across large areas. As the width of the lithographically defined physical or chemical pattern narrows (e.g., the feature size decreases), the definition of a thinner lithographically defined physical or chemical pattern becomes more difficult.

In other embodiments, the chemical pattern provides a template for self-assembly. For example, a physical pattern comprises a pattern that has topography. In some embodiments the lithographically defined pattern can be formed by physical and/or chemical processes. In other embodiments the lithographically defined pattern can be formed using topographical templates for graphoepitaxy or combined chemical and topographical templates. For example, the lithographically defined pattern can be formed using methods disclosed in one or more of the following: R. A. Segalman et al., "Graphoepitaxy of Spherical Domain Block Copolymer Films," *Adv. Mater.*, 13: 1152 (2001); Seino Y et al., "Contact hole shrink process using graphoepitaxial directed self-assembly lithography," *Micro/Nanolith. MEMS MOEMS*, 12(3): 033011; Yi, H. et al., "Flexible Control of Block Copolymer Directed Self-Assembly using Small, Topographical Templates: Potential Lithography Solution for Integrated Circuit Contact Hole Patterning," Adv. Mater., 24: 3107 (2012); Williamson, L. D. et al., "Three-Tone Chemical Patterns for Block Copolymer Directed Self-Assembly," *ACS Applied Materials & Interfaces*, 8: 2704 (2016); and Roel Gronheid et al., "Implementation of templated DSA for via layer patterning at the 7 nm node," *Proc. SPIE* 9423, Alternative Lithographic Technologies VII, 942305 (Mar. 19, 2015).

Figure 2:
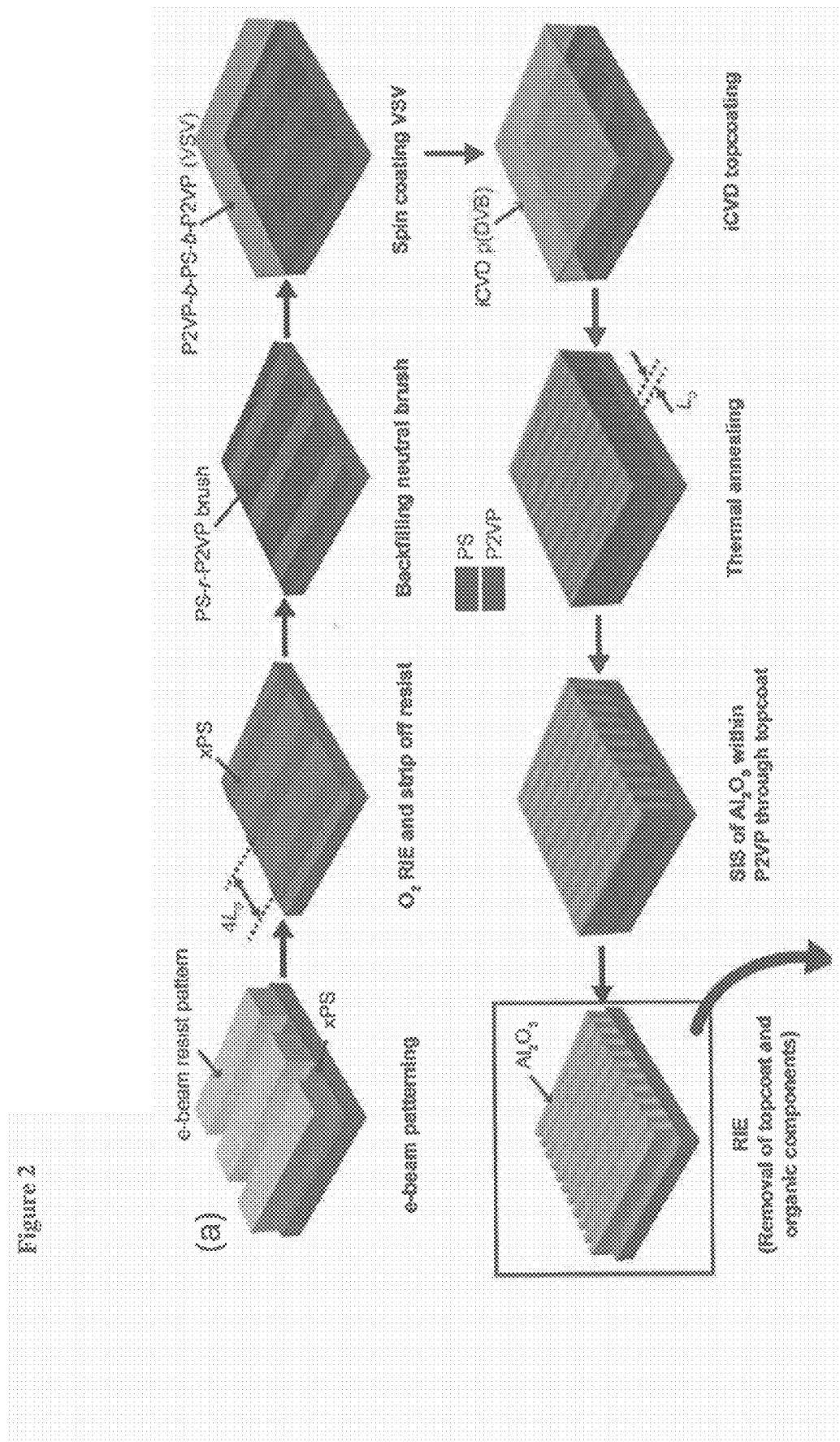
FIG. 2 shows the process flow for 4× density multiplication directed self-assembly of VSV using chemical patterns and iCVD p(DVB) topcoat.

In some embodiments, the process to create a lithographically defined chemical pattern and for directed self-assembly of a block copolymer film comprises lithography, a breakthrough etch, an trim etch, a stripping with solvent, spin coat brush and anneal, removal of excess brush (FIG. 1). In other embodiments, the process to create a lithographically defined chemical pattern and for directed self-assembly of a block copolymer film comprises e-beam patterning, reactive ion etching and stripping, backfilling with a neutral brush, and spin coating with a polymer (FIG. 2).

In another embodiment, the lithographically defined physical or chemical pattern has a constant $L_s$ (period between the chemical pattern). In yet another embodiment, the width W of the lithographically defined chemical pattern is about $L_0/2$, where $L_0$ is the natural period of the block copolymer. In still another embodiment, the width W of the lithographically defined physical or chemical pattern is about $1.5*L_0$.

In some embodiments, the block copolymer self-assembles to minimize free energy. In yet another embodiment, the block copolymer is a strongly segregating block copolymer. In still another embodiment, the block copolymer is a high $\chi$ block copolymer. In another embodiment, the block copolymer has a large Flory-Huggins interaction parameter, which is related to the energy of mixing. In still another embodiment, the block copolymer is a lamellae-forming block copolymer. In yet another embodiment, the block copolymer is a cylinder-forming block copolymer.

In other embodiments, the lithographically defined physical or chemical pattern allowed for orientation of the BCP domains through the iCVD or piCVD topcoat.

The block copolymer can include any number of distinct block polymers (i.e. diblock copolymers, triblock copolymers, etc.). A specific example is the diblock copolymer poly(styrene-block-methacrylate) (PS-b-PMMA). Any type of copolymer that undergoes microphase separation under appropriate thermodynamic conditions may be used. This includes block copolymers that have as components glassy polymers such as PS and PMMA, which have relatively high glass transition temperatures, as well as more elastomeric polymers.

The block copolymer material may include one or more additional block copolymers. In some embodiments, the material may be a block copolymer/block copolymer blend. An example of a block copolymer/block copolymer blend is PS-b-PMMA (50 kg/mol)/PS-b-PMMA (100 kg/mol).

In some embodiments, the block copolymer materials have interaction parameters ($\chi$) greater than that of PS-PMMA. The interaction parameter $\chi$ is temperature-dependent; accordingly block copolymer materials having $\chi$'s greater than that of PS-PMMA at the temperature of assembly can be used in certain embodiments. In some embodiments, block copolymers having sub-10 nm domains in the bulk used.

The block copolymer material may also include one or more homopolymers. In some embodiments, the material may be a block copolymer/homopolymer blend or a block copolymer/homopolymer/homopolymer blend, such as a PS-b-PMMA/PS/PMMA blend.

The block copolymer material may comprise any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

In one embodiment, the block copolymer is formed by reacting dodecanol with 3,3,4,4,5,5,6,6,7,7,8,8,9,9,10,10,10-heptadecafluorodecyl isocyanate. In another embodiment, the block copolymer is formed by the copolymerization of styrene with methyl methacrylate, glycidal methacrylate, hydroxyl ethyl methacrylate, acrylates with perfluoro side chains (e.g., 1H, 1H,6H,6H-perfluorohexyl-diacrylate and 1H, 1H,2H,2H-perfluorooctyl acrylate), dimethylsiloxane, lactic acid, 2-vinyl pyridine, or 4-vinyl pyridine. In certain embodiments, the block copolymer is poly(styrene-block-dimethylsiloxane) (PS-b-PDMS), poly(styrene-block-ethylene oxide) (PS-b-PEO), poly(styrene-block-lactic acid) (PS-b-PLA), poly(styrene-block-methacrylate) (PS-b-PMMA), polyhedral oligomeric silsequioxane (POSS)-containing polymers, polystyrene-block-poly(2-vinylpyridine) (PS-b-P2VP), or poly(2-vinylpyridine)-block-polystyrene-block-poly(2-vinylpyridine) (P2VP-b-PS-b-P2VP). In other embodiments, the block copolymer is PS-b-PMMA, P2VP-b-PS-b-P2VP, PS-b-PEO, or PS-PDMS.

In other embodiments, directed self-assembly is faster and results in higher quality structures. In another embodiment, the width of the lithographically defined physical or chemical pattern (W) is close to the width of a lamella (natural period of the block copolymer $L_o$) (W/$L_o$=0.5). In another embodiment, the neutral layer is backfilled by a neutral random copolymer brush. In yet another embodiment, the neutral regions minimize the interfacial energy between the substrate and the polymer films overlaying those regions (the neutral chemistry is a function of n and the preferential guiding stripe chemistry). In still another embodiment, low degrees of density multiplication, n, where n is an integer multiple between the period of the lithographically defined physical or chemical pre-pattern $L_s$ and the natural period of the block copolymer $L_o$, is preferred for faster and defect-free assembly. In a further embodiment, the film thickness is minimized within practical limits of supporting micro-phase separation in the film and domains with aspect ratios high enough for pattern transfer (film thickness t~$L_o$).

In certain embodiments, the annealing of step (e) is thermal annealing.

In another embodiment, the lithographically defined physical or chemical pattern and the neutral section have different chemical functionalities. For example, the chemical functionalities can include cross-linked polymers and grafted polymers.

In some embodiments, the topcoat is a non-preferential wetting topcoat.

In another embodiment, the topcoat induces a perpendicular ordering of lamellae. In yet another embodiment, the topcoat induces a perpendicular ordering of cylinders. In other embodiments, the topcoat on the block copolymer film controls the orientation during directed self-assembly. In still another embodiment, the topcoat enables high-resolution block copolymer assembly.

In yet another embodiment, forming the topcoat comprises iCVD or piCVD of the topcoat in a deposition chamber. In another embodiment, forming the topcoat is solvent-free. In a further embodiment, forming the topcoat occurs at low temperatures. In other embodiments, forming the topcoat does not damage or dissolve the block copolymer layer underneath the topcoat.

In some embodiments, the topcoat is uniform.

In still another embodiment, the topcoat is pinhole-free.

In a further embodiment, the topcoat is ultra-thin. In some embodiments, the thickness of the topcoat is less than about 100 nm. In another embodiment, the thickness of the topcoat is less than about 10 nm. In yet another embodiment, the thickness of the topcoat is between about 1 nm and about 5 nm.

In a further embodiment, high resolution features are patterned on the topcoat. In some embodiments, solvent annealing is not needed.

In some embodiments, the present disclosure relates to a method of forming a topcoat conformally on a non-planar structure, such as etching holes that connect layers (called vias).

In other embodiments, the present disclosure relates to a method of forming a large scale pattern directly on top of the topcoat for interconnection.

Devices Comprising Compositions of the Disclosure

In another aspect, provided herein is an article, comprising a substrate, and a coating on the substrate, wherein the coating comprises a block copolymer film and a topcoat on the block copolymer, wherein the topcoat is deposited by iCVD or piCVD.

In some embodiments of the article, the topcoat is a non-preferential wetting topcoat.

In other embodiments of the article, the topcoat induces a perpendicular ordering of lamellae. In further embodiments of the article, the topcoat induces a perpendicular ordering of cylinders.

In another embodiment of the article, forming the topcoat is in a deposition chamber.

In some embodiments, the topcoat is uniform.

In still another embodiment of the article, the topcoat is pinhole-free.

In yet another embodiment of the article, the topcoat is ultra-thin. In some embodiments, the thickness of the topcoat is less than about 100 nm. In another embodiment, the thickness of the topcoat is less than about 10 nm. In yet another embodiment, the thickness of the topcoat is between about 1 nm and about 5 nm. In a further embodiment, high resolution features are patterned on the topcoat. In still another embodiment, sub-10 nm patterns can be made on the topcoat. In some embodiments, solvent annealing is not needed.

In some embodiments, the pattern is transferred to silicon.

In a further aspect, provided herein is a method of forming a pattern on an article, comprising the steps of:
 (a) coating the article with a resist;
 (b) forming a resist pattern using lithography to form a mask;
 (c) removing the topcoat from the masked article by a first reactive ion etching;
 (d) removing the remaining polymer of the article by a second reactive ion etching; and
 (e) etching the substrate by a third reactive ion etching.

In some embodiments, the methods of forming a pattern on an article include SIS.

In another aspect, provided herein is a method of forming an inorganic pattern on an article, comprising the steps of:
 (a) contacting the article with a gaseous inorganic material;
 (b) contacting the article with a counter reactant;
 (c) optionally repeating cycles comprising steps (a) and (b);
 (d) removing the topcoat of the article by a first reactive ion etching;
 (e) removing the remaining polymer of the article by a second reactive ion etching; and
 (f) etching the substrate by a third reactive ion etching.

In a further aspect, provided herein is a method of forming a pattern on an article, comprising the steps of:
 (a) coating the article with a resist;
 (b) forming a resist pattern using lithography to form a mask;
 (c) removing the topcoat and one domain of the block copolymer from the masked article by a first reactive ion etching;
 (d) etching the substrate with a mask by a second reactive ion etching; and
 (e) stripping residues from the substrate.

In still another aspect, provided herein is a method of forming an inorganic pattern on an article, comprising the steps of:
 (a) coating the article with a resist;
 (b) forming a resist pattern using lithography to form a mask;
 (c) removing the topcoat of the article by a first reactive ion etching;
 (d) contacting the masked article with a gaseous inorganic material;
 (e) contacting the masked article with a counter reactant; and
 (f) optionally repeating cycles comprising steps (d) and (e);
 (g) removing the remaining polymer of the masked article by a second reactive ion etching;
 (h) etching the substrate by a third reactive ion etching; and
 (i) stripping residues from the substrate.

In other embodiments, the article is coated with a resist. In some embodiments, a resist is applied on top of the topcoat. In another embodiment, a traditional resist is deposited and processed on top of the topcoat allowing dual scale patterns to be formed. In still another embodiment, the topcoat is patternable using photolithography or e-beam lithography. In yet another embodiment, the grafted, cross-linked iCVD or piCVD topcoat is durable.

In some embodiments of the methods disclosed herein, the first reactive ion etching is a reactive ion etching using a gas mixture comprising chlorine or a reactive ion etching using a gas mixture comprising oxygen. In another embodiment, the first reactive ion etching is a reactive ion etching using a gas mixture comprising oxygen.

In some embodiments of the methods disclosed herein, a counter reactant is selected from the group consisting of water, $O_2$, $O_3$, $N_2O_4$, $N_2O$, $CH_3COOH$, $N_2H_4$, $NH_3$, $(CH_3)NNH_2$, $tBuNH_2$, and $CH_2CHCH_2NH_2$.

In another embodiment, a pattern can be transferred to the underlying block copolymer without removal of the topcoat. In some embodiments, a DSA pattern can be transferred to the underlying substrate without removal of the topcoat. In still another embodiment, the topcoat is transparent to sequential infiltration synthesis (SIS). In certain embodiments, the topcoat does not need to be stripped off before SIS. In other embodiments, the SIS does not react with the PS domains. In some embodiments, the polymer pattern is converted to an inorganic pattern to increase the etching selectivity. In certain embodiments, the conversion to an inorganic pattern is by SIS.

In yet another embodiment, a gaseous inorganic material diffuses through the topcoat to affect the block copolymer. In some embodiments, the gaseous inorganic material is selected from the group consisting of trimethyl aluminum (TMA), yttrium tris(2,2,6,6-tetramethyl-3,5-heptanedionate) ($Y(thd)_3$), diethyl zinc (DEZ), titanium tetrachloride ($TiCl_4$), vanadium (V) oxytriisopropoxide (VOTP), palladium (II) hexafluoroacetylacetonate ($Pd(hfac)_2$), copper bis (2,2,6,6-tetramethyl-3,5-heptanedionate) ($Cu(thd)_2$), copper (II) hexafluoroacetylacetonate hydrate ($Cu(hfac)_2$), iron tris (2,2,6,6-tetramethyl-3,5-heptanedionate) ($Fe(thd)_3$), cobalt tris(2,2,6,6-tetramethyl-3,5-heptanedionate) ($Co(thd)_3$), bis (2,2,6,6-tetramethyl-3,5-heptanedionato)barium triglyme adduct ($Ba(thd)_2$.tri), bis(cyclopentadienyl) ruthenium (Ru $(cp)_2$), disilane ($Si_2H_6$), tungsten hexafluoride ($WF_6$), bis(N, N'-diisopropylacetamidinato)copper(I) (Cu(DIA)), nickel (II) acetylacetonate ($Ni(acac)_2$), antimony pentachloride ($SbCl_5$), niobium pentachloride ($NbCl_5$), niobium pentethoxide ($Nb(OEt)_5$), titanium isopropoxide ($Ti(iOPr)_4$), tris(tetramethylcyclopentadienyl) cerium (III), cyclopentadienyl indium (InCp), tris(i-propylcyclopentadienyl) lanthanum ($La(iPrCp)_3$), bis(cyclopentadienyl) magnesium ($MgCp)_2$), bis(cyclopentadienyl) nickel ($NiCp_2$), (trimethyl) methylcyclopentadienylplatinum (IV) ($Pt(MeCp)Me_3$), bis (pentamethylcyclopentadienyl) strontium ($Sr(MesCp)_2$), tris (cyclopentadienyl) yttrium ($YCp_3$), bis(cyclopentadienyl) la dimethylzirconium ($ZrCp_2Me_2$), bis(methylcyclopentadienyl)methoxymethyl zirconium (ZrOMe), tetrakis(dimethylamino) tin (TDMASn), tetrakis(dimethylamino) zirconium (TDMAZr), tri s(dimethylamino) aluminum (TDMAAl), iridium(III) acetylacetonate ($Ir(acac)_3$), niobium pentafluoride ($NbF_5$), ferrocene ($FeCp_2$), cyclohexadiene iron tricarbonyl ($FeHD(CO)_3$), tetrakis(dimethylamino) antimony (TDMASb), aluminum trichloride ($AlCl_3$), niobium (V) iodide ($NbI_5$), tin (IV) iodide ($SnI_4$), tris (tetramethylcyclopentadienyl)gadolinium(III) ($Gd(Me_4Cp)_3$), bis(pentamethylcyclo-pentadienyl)barium 1,2-dimethoxyethane adduct (Ba(MesCp)-2-DMA), molybdenum hexafluoride ($MoF_6$), tris(tert-pentoxy)silanol (TTPSi), silicon tetrachloride ($SiCl_4$), lithium tert-butoxide (Li(tOBu)), trimethyl indium (TMIn), trimethyl gallium (TMGa), and dimethyl cadmium (TMCd). In one embodiment, the gaseous inorganic material is trimethyl aluminum.

In other embodiments, SIS selectively infuses one of the domains of the BCPs (e.g., the P2VP domains of PS-b-P2VP) with alumina. In another embodiment, the trimethyl aluminum coordinates to the nitrogen atoms in the pyridine groups. In yet another embodiment, the alumina deposited throughout the P2VP domains exhibit high etch contrast compared to the PS domains during reactive ion etching. In some embodiments, SIS permits the pattern transfer of perpendicularly oriented structures of the P2VP domains to the substrate. In another embodiment, the $Al_2O_3$ pattern is transferring to the underlying silicon substrate. In still another embodiment, the process uses a topcoat and thermal annealing, not solvent annealing. Solvent annealing has disadvantages including, but not limited to, problems with reproducibility, application for large area substrates, pattern perfection, and dewetting of the block copolymer films from substrates. iCVD and piCVD overcome many of the issues with solvent annealing. In other embodiments, SIS enhances pattern transfer.

In some embodiments of the methods disclosed herein, the second reactive ion etching is a reactive ion etching using a gas mixture comprising oxygen. In some embodiments of the methods disclosed herein, the second reactive ion etching removes the topcoat and the PS domains.

In a further embodiment, the resist is patternable using photolithography or e-beam lithography. In another embodiment, the resist is selected from the group consisting of hydrogen silsesquioxane, organosilicate, and polymethyl methacrylate. In some embodiments, the organosilicate is norbornene ethyltrimethoxysilane (NH 37) or p-chloromethylphenyltrimethoxy-silane (Sim et al., *Chem. Mater.*, 2010, 22 (10), pp 3021-3023). In one embodiment, the resist is hydrogen silsesquioxane.

In other embodiments, the resist pattern is formed by photolithography or electron-beam lithography.

In one embodiment of the methods disclosed herein, the third reactive ion etching is a reactive ion etching using a gas mixture comprising fluorine.

In some embodiments, the stripping is by using a solvent. For example, when a PMMA resist is used, the stripping is by using a solvent, including acetone, chlorobenzene, and N-methyl-2-pyrrolidone (NMP). In certain embodiments, the stripping is by hydrofluoric acid and piranha treatment.

In some embodiments, a dual pattern is formed using the methods disclosed herein. In other embodiments, a multi-pattern is formed using the methods disclosed herein. In another embodiment, the multi-pattern is a line-and-cut pattern.

In another aspect, provided herein are iCVD or piCVD topcoats with DSA create high resolution patterns for data storage, memory circuits, and micro-processors.

In some embodiments, provided herein is a data storage device comprising a pattern obtained by any one of the methods disclosed herein.

In other embodiments, provided herein is a memory circuit comprising a pattern obtained by any one of the methods disclosed herein.

In another embodiment, provided herein is a microprocessor comprising a pattern obtained by any one of the methods disclosed herein.

In certain embodiments, the iCVD or piCVD topcoat process can be integrated with the current manufacturing processes of the semiconductor and the data storage industries. In another embodiment, the iCVD or piCVD topcoat process can be integrated with other vacuum processes of the semiconductor and the data storage industries.

Advantages of the iCVD or piCVD methods disclosed herein include, but are not limited to, ability to integrate with current manufacturing processes; scalability to larger wafer sizes (e.g., >1 meter wide); uniformity of films over large areas; ultra-thin films over large areas; real-time thickness monitoring and endpoint control; economical, high-purity small molecule reactants (e.g., commercially available monomers); use various topcoat materials not available with spin coating; no solubility issues for reactants; no dissolution of the underlying block copolymer; minimal environmental impact (e.g., low-energy, solvent-free processing); no need for a curing step to remove residual solvent; a precise and controlled environment for pin-hole free film formation; tight control over topography (e.g., fewer defects and better pattern transfer); a non-preferential interface allowing for perpendicular orientation of the block copolymer during DSA; eliminating a separate step of topcoat removal during fabrication; reproducible processing in automated reactors at both lab-scale and commercial-scale; and systematic tuning of film and surface properties.

Having now described the present disclosure in detail, the same will be more clearly understood by reference to the following examples, which are included herewith for purposes of illustration only and are not intended to be limiting of the disclosure.

EXAMPLES

Example 1. Directed Self-Assembly Preparation

A. Preparing Block Copolymer (BCP) Films on Chemical Pattern

The first four steps depicted in FIG. 2 show a schematic of a process to create a lithographically defined chemical pattern and for directed self-assembly of a block copolymer film. The 6-8 nm-thick cross-linkable polystyrene (xPS) mat was first prepared on the Si wafer by spin coating with AZ NLD128 (obtained from AZ Electronic Materials) and following thermal annealing at 250° C. for 90 min. A 70 nm-thick gl-2000 (Gluonlab) e-beam resist layer was coated on xPS mat and exposed by JEOL 9300 electron beam lithography system at Center for Nanoscale Materials in Argonne National Laboratory. The e-beam doses are in the range of 260-320 $\mu C/cm^2$. Line and space (L/S) resist patterns with a period of 74 nm ($4\times L_0$ of VSV) and various widths were obtained after being developed in n-amyl acetate (ACROS ORGANICS) for 20 sec. The xPS mat in the exposed area was selectively removed by $O_2$ reactive ion etching (Oxford PlasmLab 100, RF power 100 W, 10 sccm of $O_2$ flow, 10 mTorr, for 19 sec). The remaining e-beam resist was removed by the repeated sonication with warm N-methylpyrrolidone (NMP, Sigma-Aldrich), leaving behind PS guiding stripe pattern on Si wafer (pitch 74 nm, width around 28 nm). PS-r-P2VP brush were then grafted on the surface of Si wafer between the PS stripe by spin coating of PS-r-P2VP-r-PHEMA solution (synthesized as described elsewhere (Ji, S. et al., Macromolecules 2008, 41 (23), 9098-9103), PS:P2VP:PHEMA=60:38:2 (mol %), 1 wt % in toluene), annealing at 250° C. for 20 min, and washing excess brushes with repeated sonication using warm dimethylformamide (DMF, Sigma-Aldrich) and toluene (Sigma- Aldrich) mixture (50:50 v/v). On this chemical template, a poly(2-vinylpyridine)-b-polystyrene-b-poly(2-vinylpyridine) (VSV) film was spin coated with AZ PME844 (obtained from AZ Electronic Materials). Resulting thickness was around 38 nm.

Figure 3:
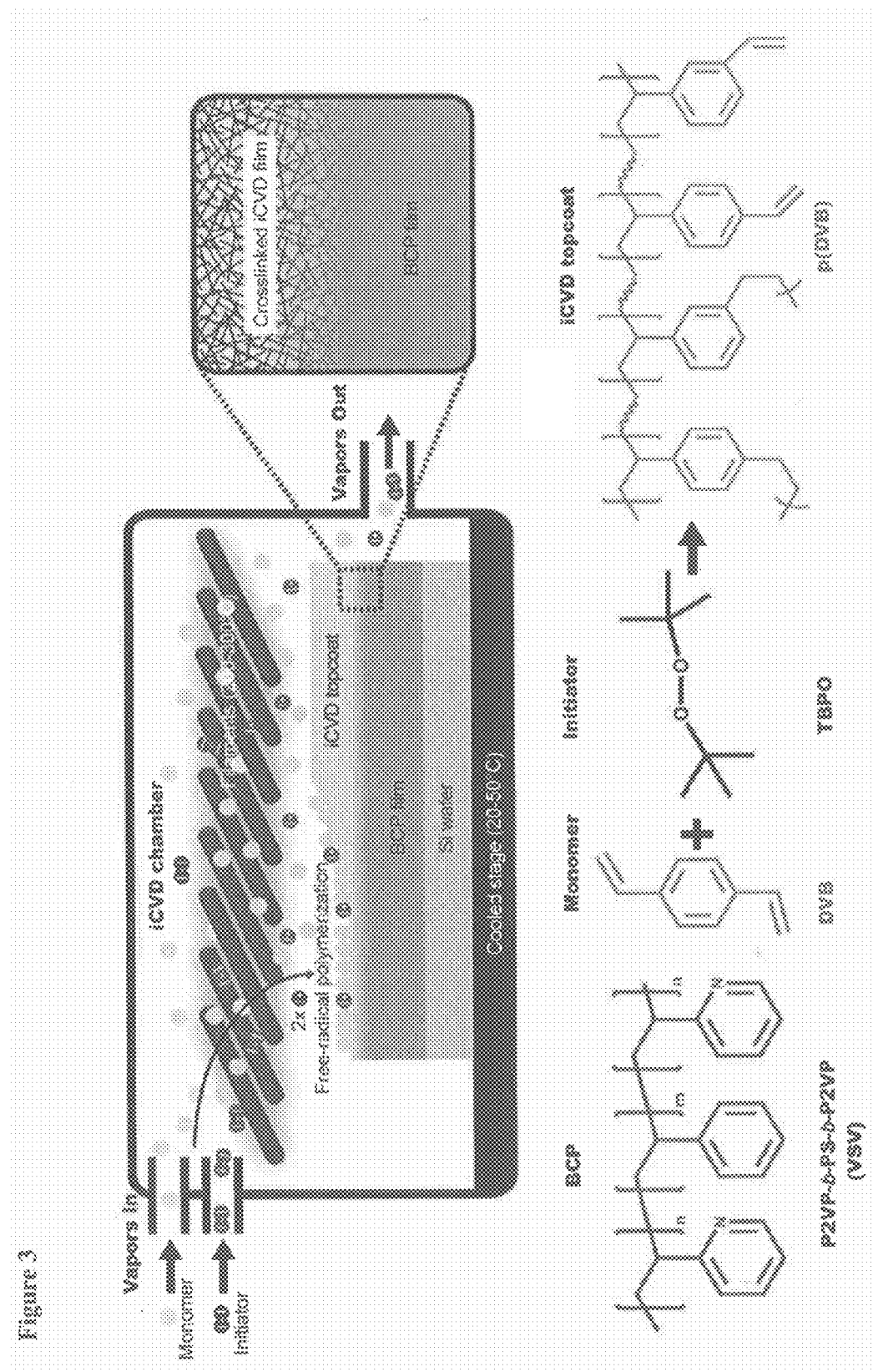
FIG. 3 shows an initiated chemical vapor deposition (iCVD) process for forming a cross-linked topcoat directly on a block copolymer (BCP) film. Vapor-phase vinyl monomer and initiator flow through an array of heated filaments. The initiators are cracked to form radicals near the heated filaments. The monomers and radicals adsorb on the cooled free surface of block copolymer film and partially diffuse into a block copolymer film. Then, a cross-linked topcoat film grows from the surface of a block copolymer film via free radical polymerization. Block copolymer and iCVD topcoat are seen to be interdiffused at the interface.

B. Initiated Chemical Vapor Deposition (iCVD) Topcoat and Thermal Annealing for Directed Self-Assembly Using a PS-b-P2 VP System During initiated chemical vapor deposition (iCVD) (FIG. 3) on a block copolymer (BCP) film, vapors of a monomer and an initiator flowed through into a vacuum chamber. In the chamber, the modest temperature (~250 to 300° C.) of the array of resistively heated filament wires caused the initiator to decompose, producing free radicals. However, the monomers were more stable and remain intact, such that free radical polymerization ensued from the combination of species arriving at the surface. The surface was typically held near room temperature by cooling down the substrate stage in order to promote the adsorption of reactive species. In some cases, the free radicals created in the vapor phase reacted directly with the substrate, resulting in an active site from which grafted polymer chains grew. Because the iCVD reactants were small molecules capable of being solvated in the BCP layer, there was a possibility of a diffuse interface between the BCP and iCVD layers. Potential reactions between the iCVD reactants and the BCP should also be considered. A highly cross-linked iCVD topcoat film grows from the top surface of a block copolymer film via free radical polymeralization. As a result, the iCVD topcoat traps chains of the block copolymer at the interface, generating a nearly non-preferential interface for a given block copolymer system.

For the iCVD topcoat, divinylbenzene (DVB) was selected as the monomer for its ability to form robust organic networks of exceptionally low roughness. The iCVD approach was ideal for synthesizing thin films of poly (divinylbenzene) (p(DVB)), as the insoluble nature of p(DVB) was incompatible with solution-based thin film forming methods. Ultra-thin pinhole free layers are also challenging to achieve by traditional spin coating due to the surface tension effects. However, iCVD readily produced continuous films of nanoscale thickness as a result of low roughness of p(DVB) combined with the absence of solvents. Such defect-free and ultra-thin films were desirable because the topcoat layer eventually was etched for pattern transfer to silicon.

The iCVD chamber was described in Lau, K. K. S. and Gleason, K. K., Macromolecules 2006, 39 (10), 3688-3694. The liquid monomer (Divinylbenzene, DVB, technical grade, 80%, Aldrich) and initiator (tert-Butyl Peroxide, TBPO, 98% Aldrich) were used without further purification. The monomer was vaporized in the liquid jar maintaining at 55° C. and the initiator was kept at room temperature. Both vapors were introduced through heated mass flow controllers (MKS Instrument). The labile peroxide bond of the initiator was thermally broken by a filament array of parallel nickel-chromium filaments (Goodfellow) at a distance of 3 cm from the substrate. The filament and the substrate temperatures were monitored by two thermocouples (Type K, Omega Engineering). The substrate temperature was adjusted using a chiller/heater (NESLAB). The mass uptake of the films was measured by a temperature-controlled quartz microbalance (QPOD, Infincon) underneath the filament. p(DVB) topcoats were coated on block copolymer films, and p(DVB) films were simultaneously deposited on Si wafers in the same batch for monitoring the thicknesses and further analysis. The deposition conditions were as follows: a monomer flow rate of 0.8 sccm, an initiator flow rate of 4.2 sccm, a pressure of 100 mTorr, the filament and substrate temperatures of 250° C. and 30° C., respectively. The deposition time (~75 min for 7 nm thick topcoat) was intentionally slowed down to control the thickness precisely and reliably with our homemade iCVD. Variable-angle spectroscopic ellipsometers (M-2000 & alpha-SE, J. A. Woollam) were used to measure film thicknesses. All thickness measurements were performed at three 65°, 70°, and 75° incidence angles using wavelengths from 400 to 1000 nm for M-2000 and from 380 to 900 nm for alpha-SE. A nonlinear least-squares minimization was used to fit ellipsometric data of dry films to the Cauchy-Urbach model. The thickness was obtained upon convergence of the algorithm. Thermal annealing for directed self-assembly was performed right after iCVD process inside of the glove box filled with nitrogen ($O_2$ and $H_2O$<0.1 ppm each). Samples were annealed on a hot plate pre-heated at 250° C. for 8 h, and then cooled down to room temperature on a cool metal plate.

C. Pattern Transfer with Sequential Infiltration Synthesis and Reactive Ion Etching A sequential infiltration synthesis (SIS) process selectively deposited alumina into the polyvinylpyridine (PVP) domains. Because the SIS precursors, vapors of trimethylaluminium and water readily diffused through the ultra-thin and inert p(DVB), the step usually needed to strip the topcoat prior to SIS was eliminated. The polystyrene (PS) domains of the VSV were also inert to SIS precursors. Reactive ion etching (RIE) steps removed both the topcoat, PS domains, and the remaining organic materials in the PVP domains. Therefore, the remaining $Al_2O_3$ patterns provided the high etch resistance required for pattern transfer into the underlying silicon.

Figure 4A:
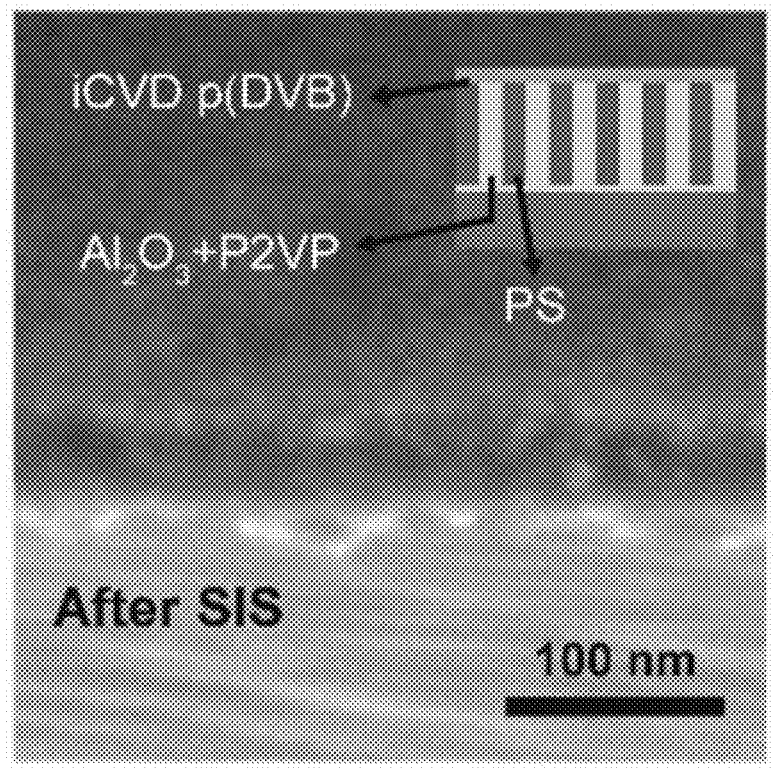
FIG. 4A shows a 45°-tilted cross-section SEM image of self-assembled VSV film between neutral brush and iCVD p(DVB) topcoat after SIS through the topcoat.
Figure 4B:
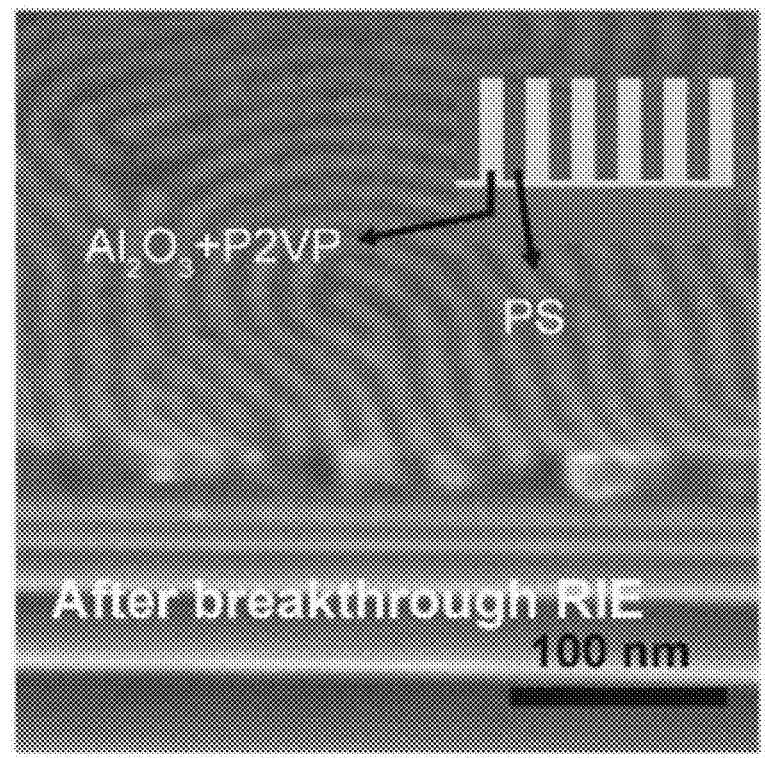
FIG. 4B shows a 45°-tilted cross-section SEM image of self-assembled VSV film between neutral brush and iCVD p(DVB) topcoat after SIS through the topcoat and breakthrough $BCl_3/Cl_2$ RIE.
Figure 4C:
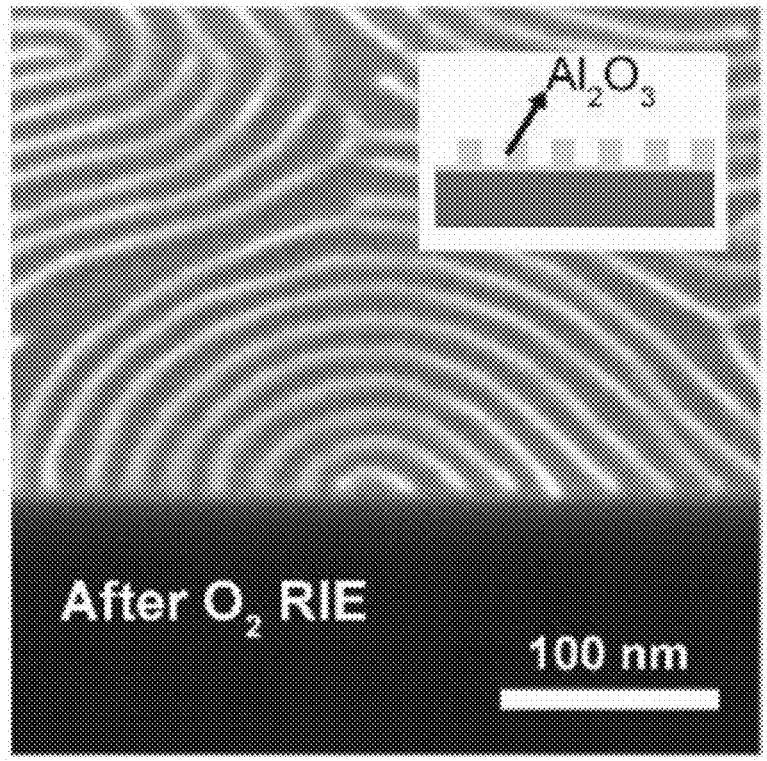
FIG. 4C shows a 45°-tilted cross-section SEM image of self-assembled VSV film between neutral brush and iCVD p(DVB) topcoat after SIS through the topcoat, breakthrough $BCl_3/Cl_2$ RIE, and $O_2$ RIE.
Figure 4D:
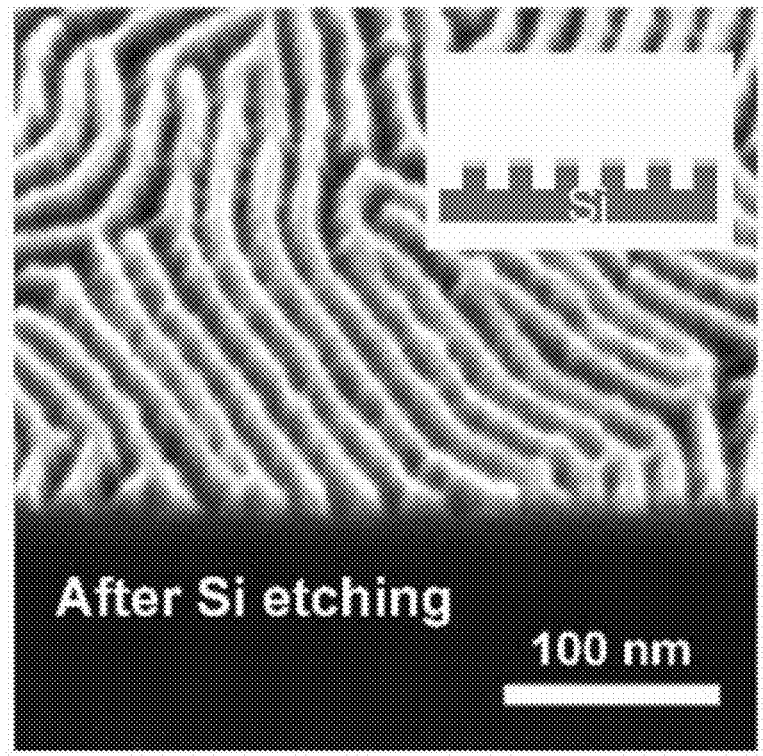
FIG. 4D shows a 45°-tilted cross-section SEM image after pattern transfer to Si substrate by $SF_6/O_2$ RIE.

Scanning electron micrographs (SEM) were obtained to demonstrate the process steps for pattern transfer. As expected, FIG. 4A reveals that the featureless iCVD topcoat completely covers the morphology of the underlying BCP. A brief $BCl_3/Cl_2$ RIE process (FIG. 4B) followed by a subsequent $O_2$ RIE fully removes the remaining PS domains and residual organics, resulting in clear alumina fingerprint patterns (FIG. 4C). The use of a two-step etching process to remove organic components will be discussed later. The subsequent $SF_6/O_2$ RIE successfully transferred the alumina fingerprint pattern to Si wafer as displayed in FIG. 4D.

SIS of $Al_2O_3$ was performed at atomic layer deposition system (ARRADIANCE GEMStar-8). Directed assembled VSV film with iCVD topcoat was loaded in the reactor and chamber was evacuated. The temperature of the chamber was kept at 95° C. Trimethylaluminium (TMA) precursor was first introduced by 10 pulses. Each pulse comprises of 100 ms TMA dose and 10 s pause. Then, TMA was kept in the chamber for 20 min (above atmosphere pressure) so that TMA can diffuse into the VSV film through topcoat. Next, a purge with 200 sccm $N_2$ flow for 5 min and evacuation of chamber for 1 min removed excess TMA and byproducts. The $H_2O$ dose was given in the same fashion with TMA. After SIS, the removal of topcoat and organic components was performed with Oxford PlasmaLab 100 system. Topcoat was first removed by pre-breakthrough reactive ion etching (RIE) (RF power 50 W, ICP power 300 W, $Cl_2$ 20 sccm+ $BCl_3$ 10 sccm, 7 mTorr, for 13 sec). The remaining polymers were removed by $O_2$ RIE (RF 25 W, $O_2$ 50 sccm, 80 mTorr, for 2 min). The thin $Al_2O_3$ layer formed by SIS at the neutral brush was then removed by additional breakthrough RIE (RF power 100 W, ICP power 600 W, $Cl_2$ 20 sccm, 10 mTorr, for 7 sec). DSA pattern masked by HSQ pattern was then transferred to Si wafer based on the RIE recipe (RF power 15 W, ICP power 800 W, $O_2$ 50 sccm+$SF_6$ 33 sccm, for 60 sec) (Johnston, D. E. et al., *Plasma etch transfer of self-assembled polymer patterns*, 2012; pp 83280A-83280A-8).

Figure 5:
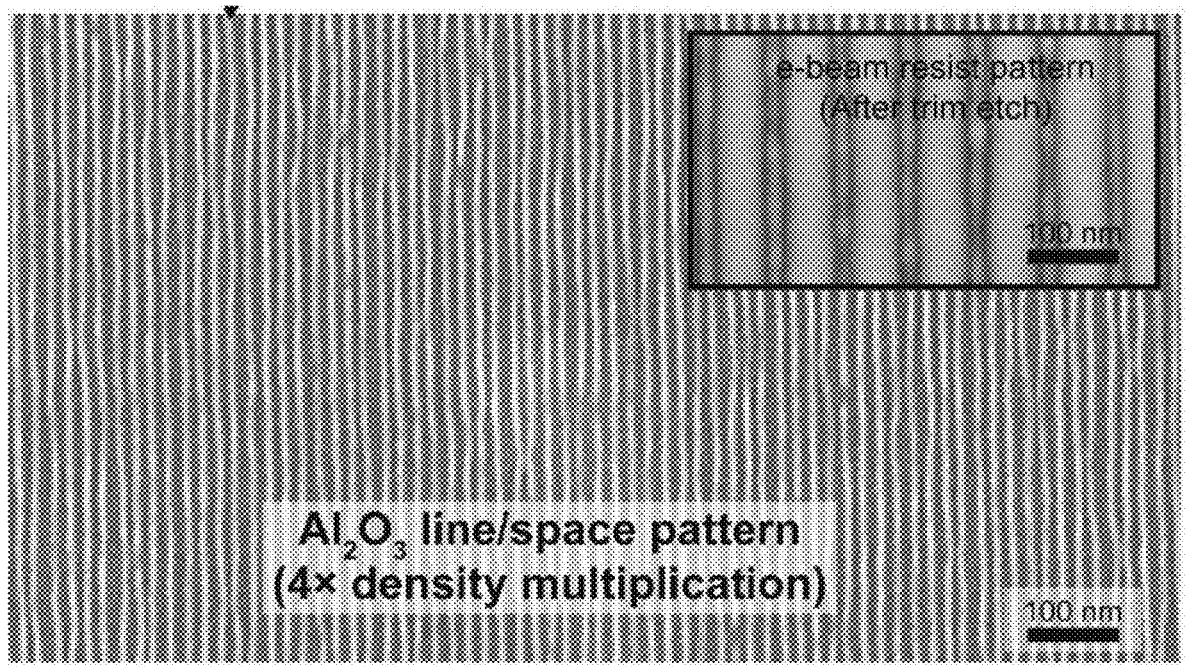
FIG. 5 shows a top-down SEM image of alumina line/space pattern realized by 4× density multiplication directed self-assembly (DSA) (full-pitch: 18.5 nm) from an e-beam pattern (insert, full-pitch: 74 nm).

For directed self-assembly (DSA) patterning (FIG. 2), VSV was spun cast onto a chemically pre-patterned substrate. The ratio of the natural lamella size of the VSV to the periodicity of the lithographically defined pattern of the substrate is designed to yield 4× reduction in pitch. Next, the iCVD p(DVB) topcoat was grown directly on top of the VSV, followed by thermal annealing to achieve DSA. The sequential infiltration synthesis (SIS)/reactive ion etching (RIE) steps above produced alumina line/space patterns with half pitch dimension of 9.3 nm (FIG. 5). This represents the expected increase of a factor of 4 in pattern-density over e-beam lithography patterns onto which the BCP was spun cast.

D. Post-Patterning on the iCVD Topcoat

Figure 6:
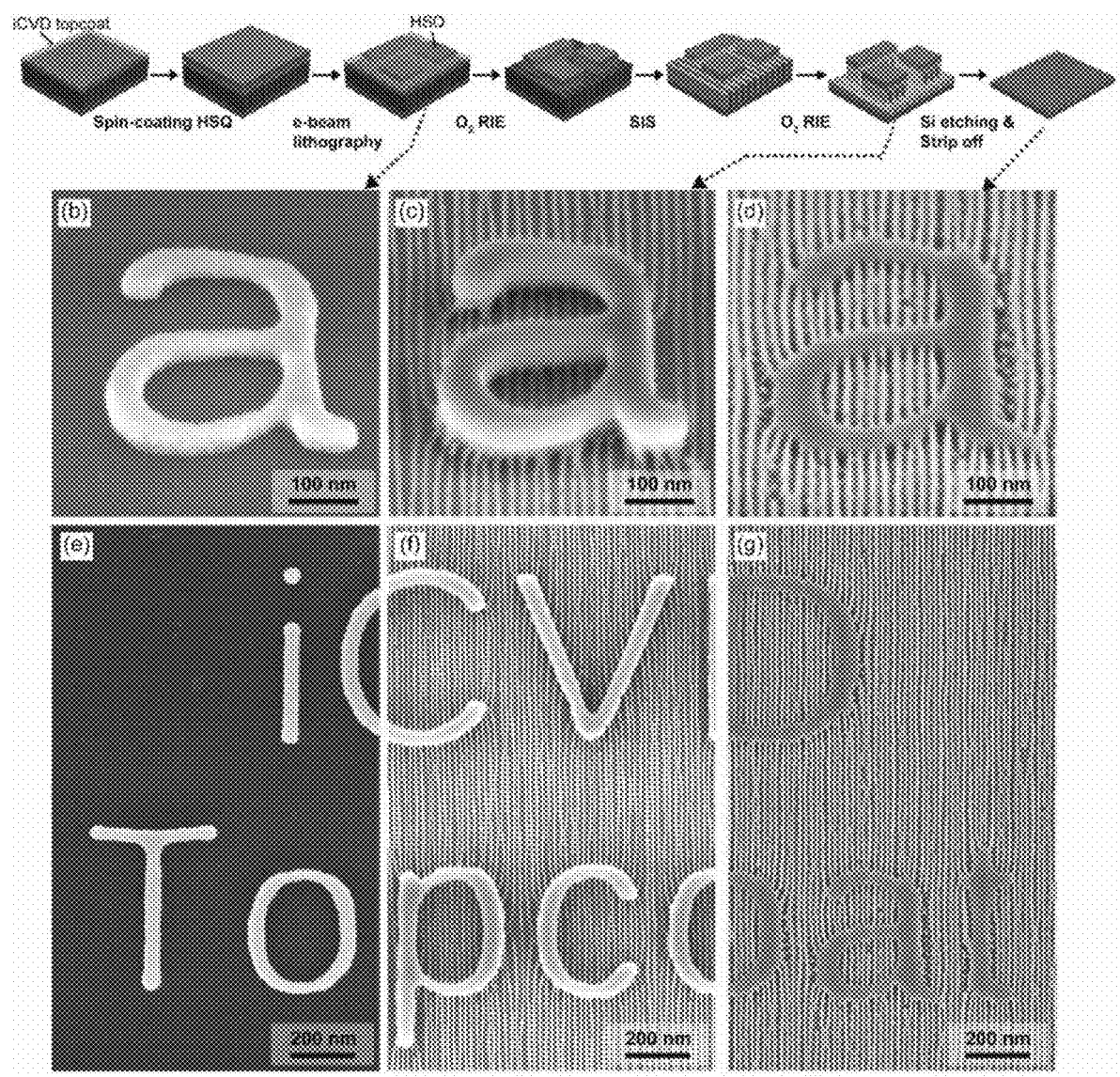
FIG. 6 shows panels depicting a process flow for pattern transfer and cut-mask application with iCVD topcoat. E-beam lithography is possible on top of a fully cross-linked iCVD p(DVB) topcoat after DSA. (b-d) 45°-tilted cross-section and (e-f) top-down SEM images after (b, e) hydrogen silsesquioxane (HSQ) patterning, (c, f) SIS and removal of iCVD topcoat and PS domain, and (d, g) Si etching and strip off residues. Simple periodic DSA pattern is trimmed into the desired arbitrary pattern shapes.

The iCVD p(DVB) is mechanically and chemically robust as a result of its high degree of cross-linking. It is also insoluble. Thus, conventional lithographic resists can be spun cast directly on to the topcoat, allowing for additional features to be defined at a second larger scale. By following the process shown in FIG. 6 (panel a), a hydrogen silsesquioxane (HSQ) pattern, which spells out "iCVD Topcoat" (FIG. 6, panels e-g) was prepared by e-beam lithography on top a 30 nm-thick iCVD p(DVB) film. In this case, an iCVD topcoat thicker than 7 nm is required to effectively protect the VSV films from solvents of the HSQ solution. As shown in FIG. 6 (panels b and e), HSQ pattern was clearly observed on the featureless surface of iCVD topcoat. The thicker iCVD topcoat, however, limits the diffusion of SIS precursors into the VSV films, meaning the iCVD topcoat must be pre-etched by $O_2$ RIE prior to SIS. After the SIS/RIE steps, alumina line/space patterns with full-pitch of 18.5 nm were developed outside of HSQ pattern (FIG. 6, panels c and f). Finally, the directed self-assembly pattern was successfully transferred to the designated regions of Si wafer masked by HSQ pattern (FIG. 6, panels d and g). This second lithographic process models existing semiconductor manufacturing processes for FinFET logic and memory circuits in which a cut-mask is overlaid on grating patterns to fabricate device-oriented patterns. The defects in FIG. 5 and FIG. 6 are believed to be mainly ascribed to SIS/RIE processes rather than the DSA behavior of BCPs because the line collapses were observed after removal of organic components from a VSV film. Therefore, further optimization of process conditions should be able to improve the quality of the patterns.

For post-patterning on topcoat/VSV sample, thickness of iCVD p(DVB) topcoat was increased to 30 nm. The process up to thermal annealing was identical with the one with thin iCVD topcoat described above. After directed self-assembly, a 50 nm-thick HSQ film was spun cast with XR-1541 (Dow Corning) on VSV/topcoat. E-beam pattern was then exposed by JEOL 9300 system with area dose of 1,400 μC/cm$^2$ and developed by MF-CD-26 (Dow Chemical) at 50° C. for 2 min. Exposed iCVD topcoat was pre-etched with $O_2$ RIE (RF power 20 W, 10 sccm of $O_2$ flow, 30 mTorr, for 50 sec). After 5 cycles of SIS, thin $Al_2O_3$ layer at top surface stemming from SIS at oxidized surface of VSV was first removed by brief breakthrough RIE (RF power 50 W, ICP power 300 W, $Cl_2$ 20 sccm+$BCl_3$ 10 sccm, 7 mTorr, for 29 sec). Subsequent $O_2$ RIE (RF 25 W, $O_2$ 50 sccm, 80 mTorr, for 2 min) removed PS domains outside of the HSQ pattern. The DSA pattern masked by the HSQ pattern was then transferred to Si wafer based on the RIE recipe described above (Johnston). Finally, residues (HSQ and alumina-containing VSV) were stripped off by HF and piranha treatment.

Example 2. Grazing-Incidence Small Angle X-Ray Scattering (GISAXS)

Figure 7:
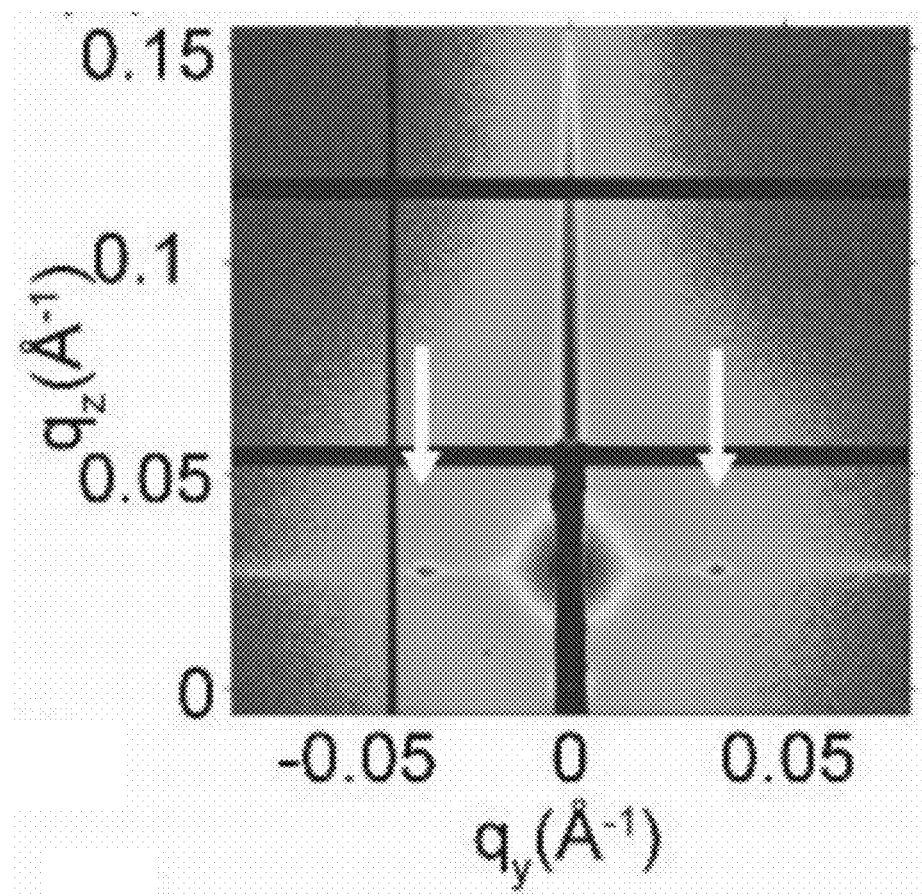
FIG. 7 shows the grazing-incidence small angle x-ray scattering (GISAXS) pattern obtained from a self-assembled P2VP-b-PS-b-P2VP (VSV) film between the neutral brush and an iCVD p(DVB) topcoat.

Grazing-incident small-angle X-ray scattering (GISAXS) (FIG. 7) verifies the perpendicular orientation of the VSV under the iCVD topcoat. The incidence angle of the x-ray beam, 0.220, exceeded the critical angle for p(DVB), as required for penetrating the topcoat, while falling below the critical angle of the silicon substrate. The in-plane scattering peak at $q_y$=0.0339±0.0001 Å$^-$ corresponded to perpendicularly oriented lamellae having a spacing of 18.5 nm.

A 38 nm-thick VSV film was prepared on neutral substrate modified by random copolymer brush instead of a chemical pattern. A 7 nm-thick iCVD topcoat was deposited on top of a VSV film with same process described above. The sample was then annealed at 250° C. for 8 hours. The GISAXS experiment was conducted at the 8-ID-E beamline in the Advanced Photon Source (APS), Argonne National Laboratory using x-rays with a wavelength of λ=1.6868 Å and a beam size of ~100 μm (h) and 20 μm (v). A 2-D PILATUS 1M-F detector was used to capture the scattering pattern and was situated at 2165 mm from sample. GISAXS pattern from self-assembled VSV film between neutral brush and 7 nm-thick iCVD p(DVB) topcoat was taken in a vacuum chamber at an incident angle of 0.220, above the critical angles of polymers and below the critical angle of the dilicon substrate. The raw scattering intensity was corrected for solid angle correction, efficiency correction for medium (e.g., air) attenuation and detector sensor absorption, polarization correction, flat field correction for removing artifacts caused by variations in the pixel-to-pixel sensitivity of the detector by use of the GIXSGUI package provided by APS, Argonne National Laboratory. In addition, the $q_y$ linecut was obtained from a linecut across the reflection beam center.

Example 3. Time-of-Flight Secondary Ion Mass Spectrometry (ToF-SIMS)

Figure 8A:
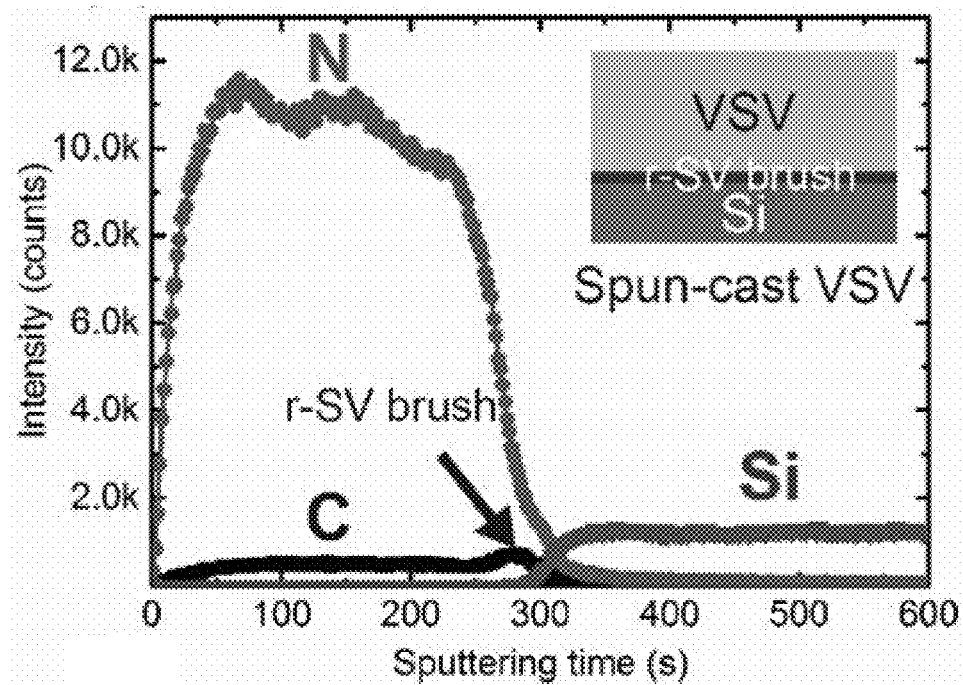
FIG. 8A shows panels depicting depth profiling of samples measured by time-of-flight secondary ion mass specrometry after spin coating of VSV on a neutral brush layer.
Figure 8B:
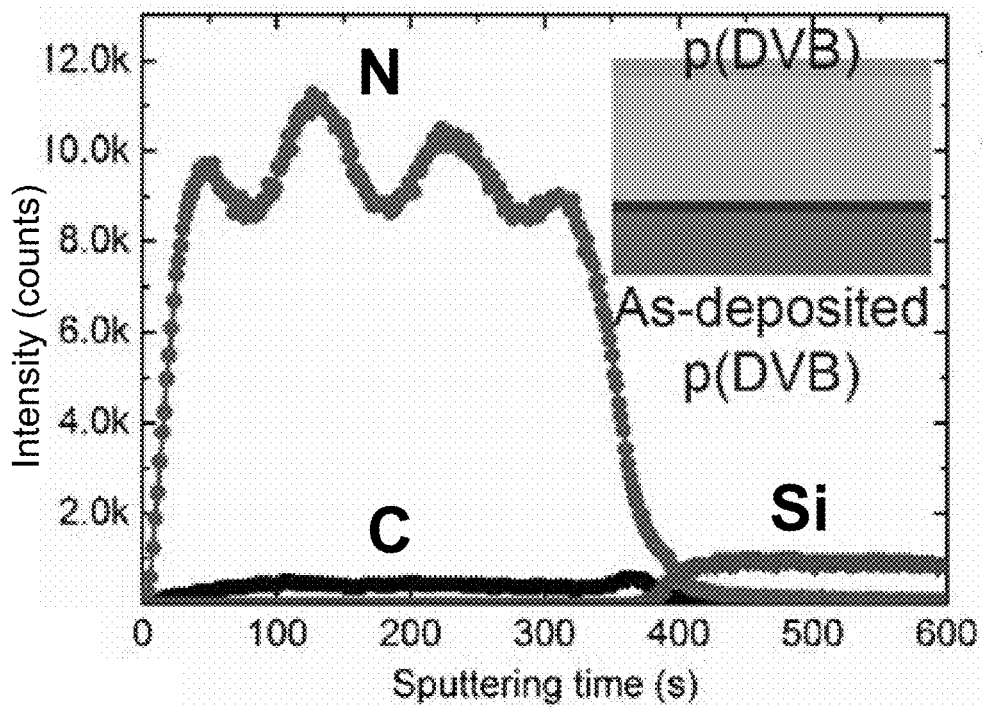
FIG. 8B shows panels depicting depth profiling of samples measured by time-of-flight secondary ion mass specrometry after spin coating of VSV on a neutral brush layer followed by iCVD.
Figure 8C:
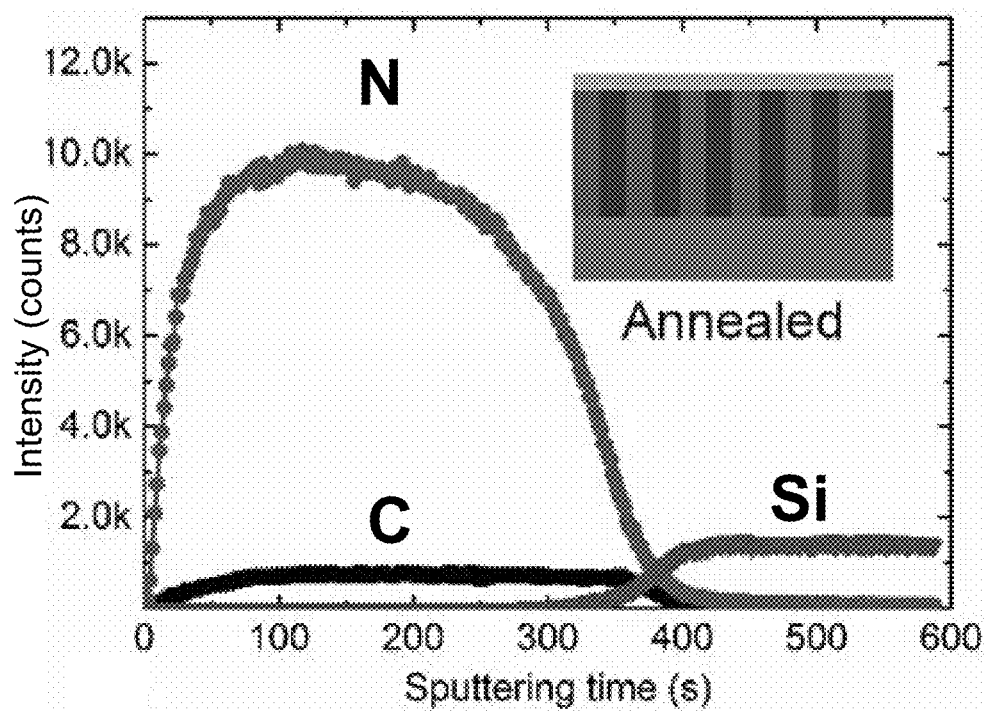
FIG. 8C shows panels depicting depth profiling of samples measured by time-of-flight secondary ion mass specrometry after spin coating of VSV on a neutral brush layer followed by iCVD and thermal annealing.

The ability of iCVD p(DVB) topcoat to induce the desired perpendicular ordering of lamella was tested using poly(2-vinylpyridine)-block-polystyrene-block-poly(2-vinylpyridine) (P2VP-b-PS-b-P2VP, VSV). The VSV was spun cast onto an unpatterned neutral random copolymer brush layer on the surface of a silicon wafer. Next, a 7 nm thick p(DVB) layer was deposited and followed by thermal annealing. The thickness of topcoat allowing reliable deposition of smooth film (root mean square roughness: 0.4-0.7 nm) was chosen. Time-of-Flight Secondary Ion Mass Spectrometry (ToF-SIMS) depth profiles of nitrogen (N), carbon (C), and silicon (Si) revealed the evolution of perpendicular orientation through the key process steps. After spin coating of VSV onto a neutral substrate (FIG. 8A), the periodic and slight fluctuation of N profile of VSV exhibited some degree of parallel orientation, particularly near the free interface. The iCVD process enhanced this parallel orientation (FIG. 8B). The mobility required to produce this increased ordering could result from the VSV becoming plasticized by the iCVD vapors and/or the VSV being lightly annealed by the heated filaments in the iCVD chamber. The compositional oscillations completely disappeared after the thermal anneal (FIG. 8C), as expected upon successful conversion to the desired perpendicular orientation by iCVD p(DVB) topcoat.

Samples for ToF-SIMS analysis were prepared by the same procedure with GISAXS sampling. Depth profiling experiments were performed using a TOF-SIMS mass spectrometer (TOFSIMS.V, IonTOF GmbH, Münster, Germany) located at the Materials Research and Technology department of the Luxembourg Institute of Science and Technology (LIST, Belvaux, Luxembourg). This instrument is equipped with a Liquid Metal Ion Gun (LMIG) which delivers a pulsed ion beam of bismuth clusters. All the experiments presented were carried out with Bi3 with a kinetic energy of 25 keV. The secondary ions emitted by the sample surface were accelerated into a reflectron-type Time-Of-Flight mass analyzer. A cesium beam (Cs+, 3 kV) was used to sputter the sample over a crater size of 250 microns. Spectra were collected from a 50×50 $\mu m^2$ area in the center this crater. A low energy (~20 eV) electron flood gun was used to compensate for the local charge accumulation.

Example 4. Interfacial Analysis on VSV and iCVD p(DVB) Topcoat

Figure 9:
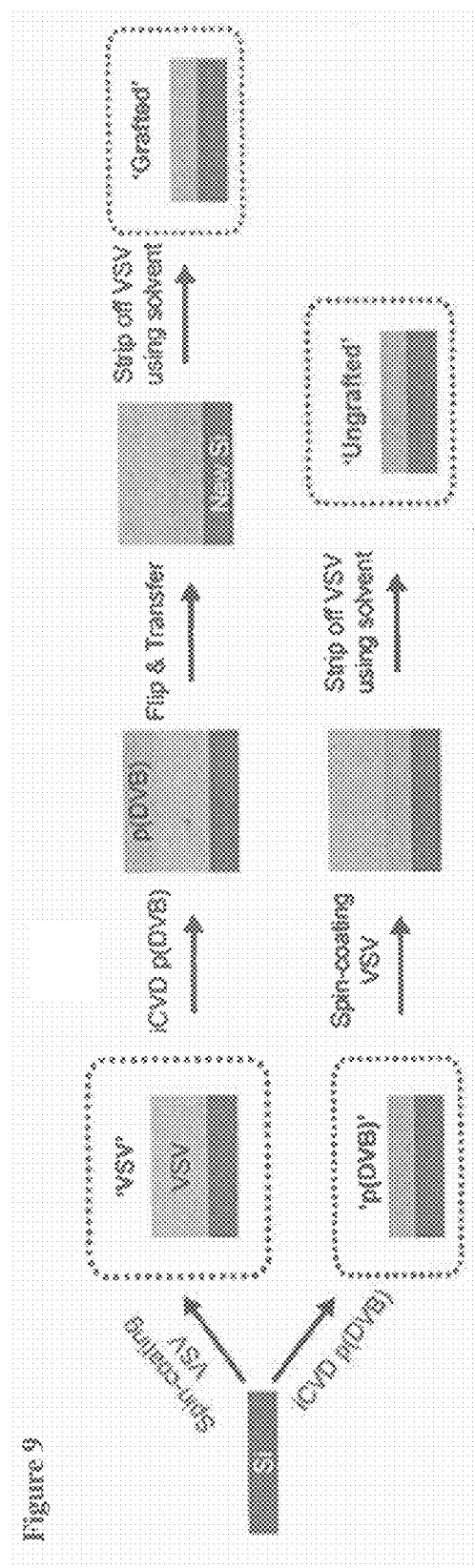
FIG. 9 depicts a schematic of sample preparation for interfacial analysis.
Figure 10:
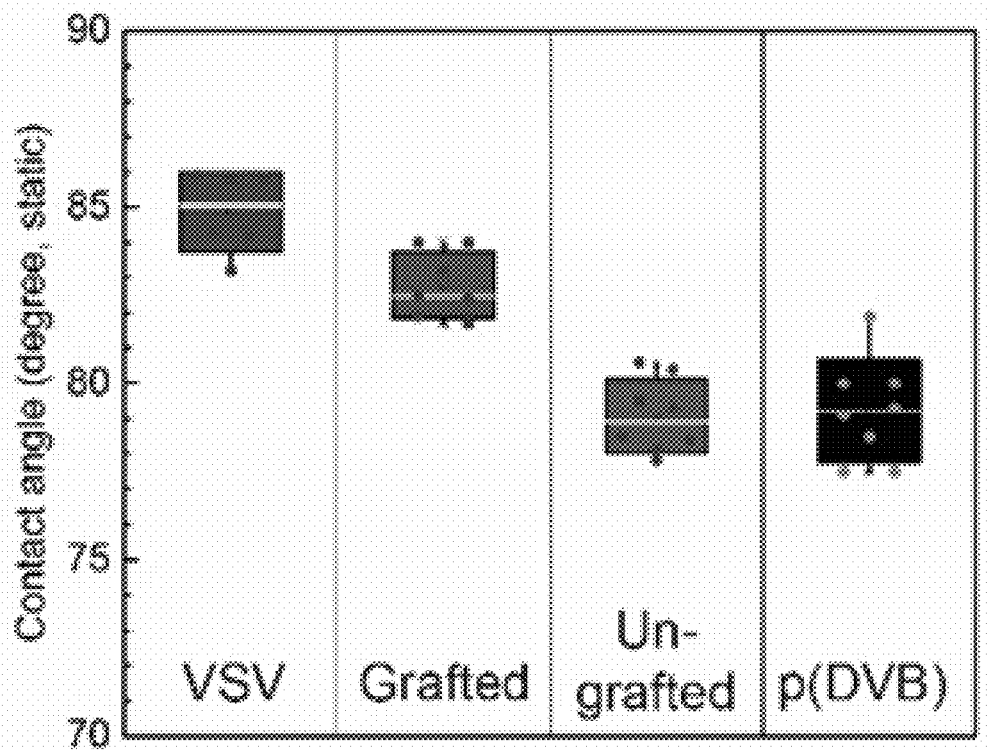
FIG. 10 depicts a graph of the water contact angles of grafted and ungrafted interfaces in comparison with VSV and p(DVB).

To further understand the observed neutral behavior of the iCVD p(DVB) as a result of forming a diffuse interface with VSV, two methods for creating bilayers were compared (FIG. 9): 1) VSV was spun cast onto an iCVD layer and will be termed "ungrafted", and 2) the iCVD film was grown on top of the VSV and will be termed "grafted". Both types of bilayers were exposed to the mixture of toluene and dimethylformamide (50:50, v/v), which is a good solvent for VSV, followed by contact angle measurements with water (FIG. 10). For the ungrafted interface, the contact angle (79.3°) is comparable to that of a single layer p(DVB) (79.8°) used as a control. This similar hydrophobicity suggests that most or all of the VSV dissolved away from the ungrafted interface. However, the contact angle after washing of the grafted bilayer was significantly higher (83.5°) and indeed close to that of a single layer VSV control (84.90). The clear difference indicates that not all of the VSV was removed from the grafted bilayer, consistent with the hypothesis of a diffuse interface where the p(DVB) is entangled and/or grafted with VSV.

Figure 11:
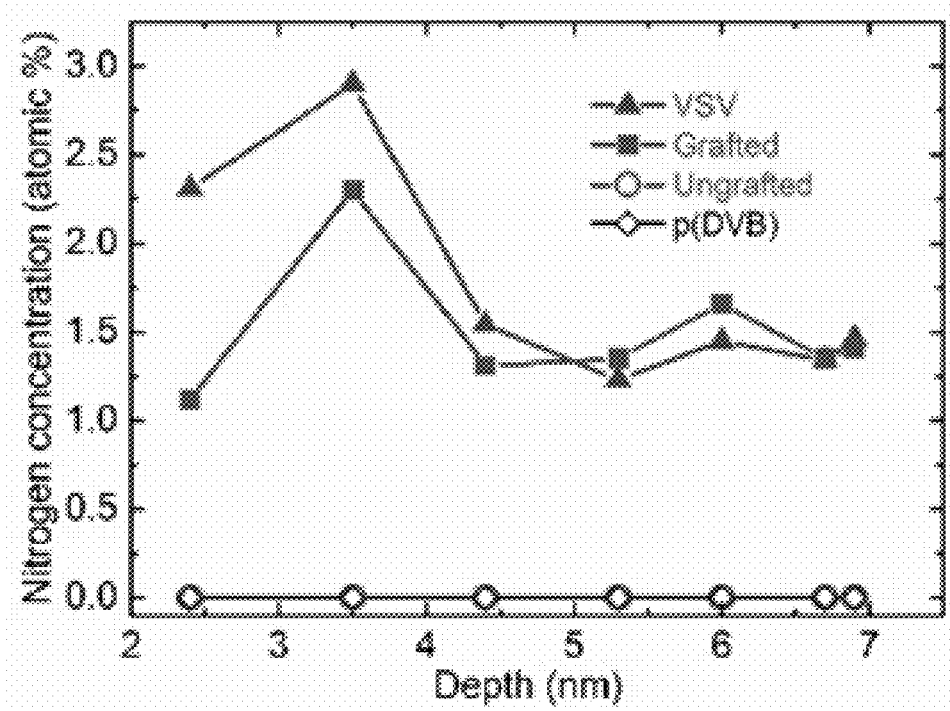
FIG. 11 depicts a graph of angle-resolved XPS depth-profiles of nitrogen up to ~7 nm depth penetration from the surface.
Figures 12, 13:
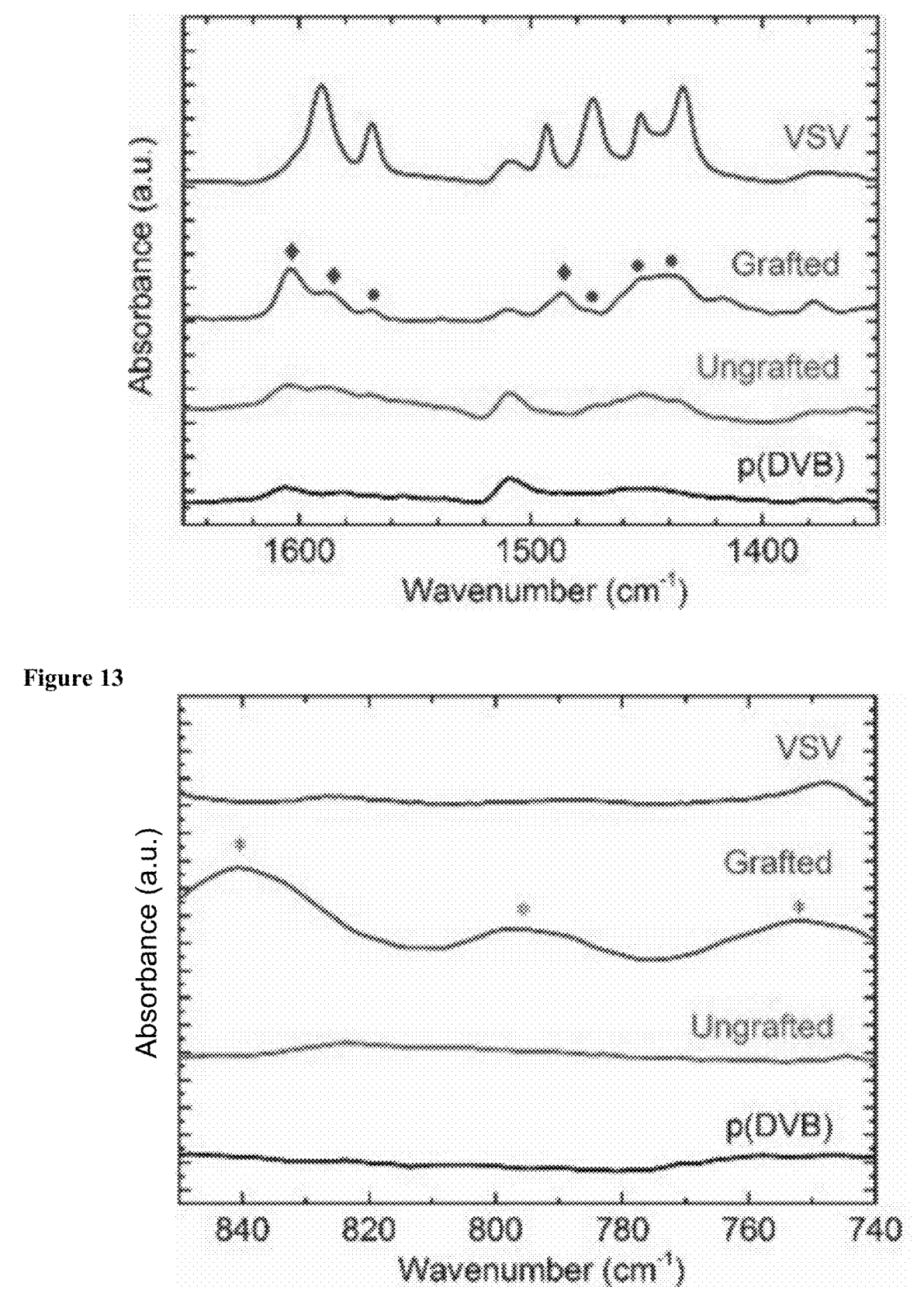

Angle-resolved X-ray photoelectron spectroscopy (AR-XPS) (FIG. 11) detected nitrogen at the grafted interface (■), confirming that pyridine from the VSV (▲) has remained behind. No nitrogen was detected by ARXPS from the ungrafted interface (o). Attenuated Total Reflectance Fourier Transform Infrared spectroscopy (ATR-FTIR) also clearly revealed pyridine moieties (•) only at the grafted interface (FIG. 12). Evidence of chemical reaction of VSV as a result of the iCVD process is confirmed by the appearance of polysubstituted pyridine stretches (♦) from the grafted interface along with their absence from the ungrafted control. The low wavenumber region (FIG. 13) probes for the existence of the polysubstituted pyridines and/or benzenes of PS. The C—H deformation vibration of disubstituted pyridine and/or benzenes (*) were observed only in grafted interface.

A. Sample Preparation for AR-XPS and Contact Angle Measurement

Figure 14:
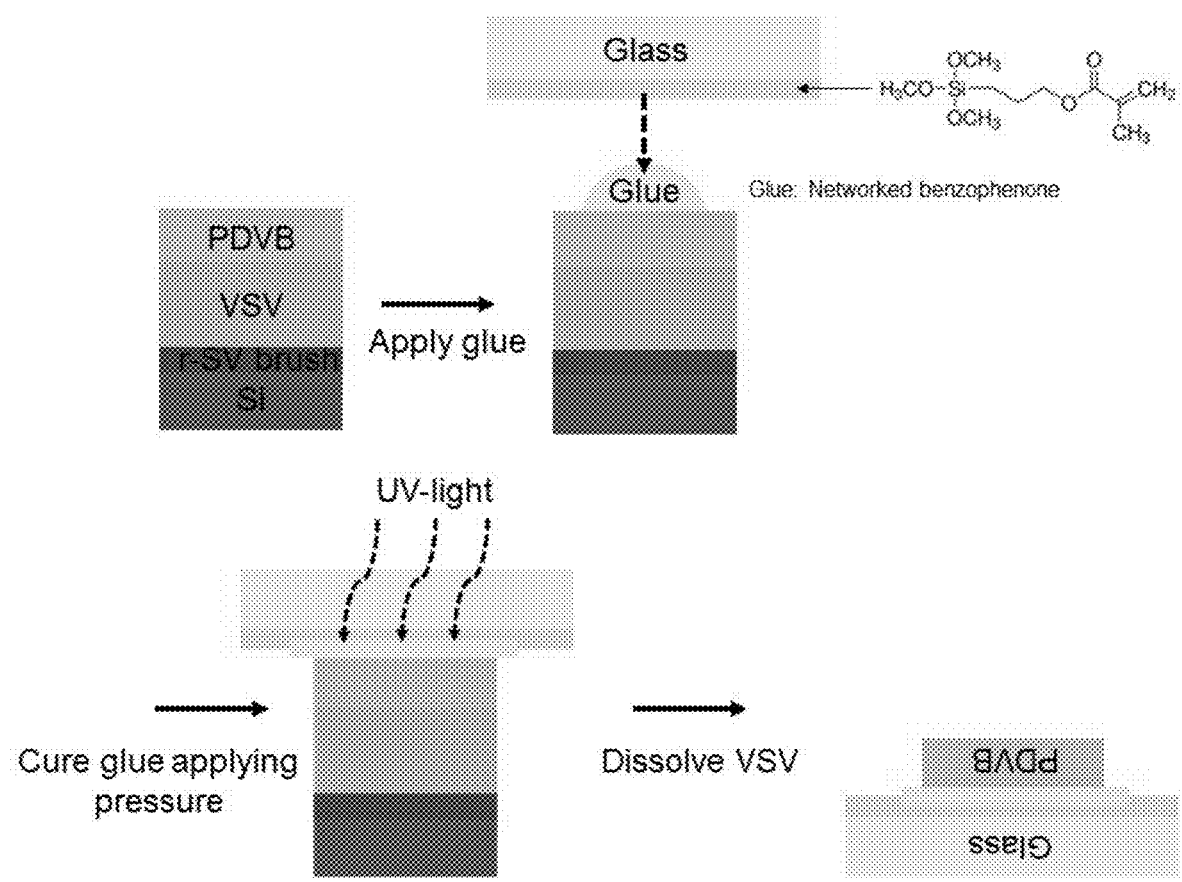
FIG. 14 shows a schematic of sample preparation for angle-resolved X-ray photoelectron spectroscopy (AR-XPS) and water contact angle measurement.

The roughness of the films is critical for angle-resolved X-ray photoelectron spectroscopy (AR-XPS) and water contact angle measurement. For the perfect flatness, the "Grafted" sample was prepared as described (Inoue, T., et al., *Advanced Materials Interfaces* 2015, 2 (10), 1500133) and in FIG. 14. In brief, liquid glue (Benzophenone composite) was applied on the p(DVB) topcoat. In order to make strong coupling between glass and glue, a silane layer was coated on the glass. Then the glue was cured through the glass by UV-irradiation applying the pressure. After dipping sample into chlorobenzene for 12 hours, VSV film was dissolved so that a glass substrate with p(DVB) topcoat can be separated from Si wafer. Then, a glass substrate with p(DVB) topcoat was washed with repeated sonication using warm mixture of dimethylformamide and toluene (v/v=50: 50) to completely remove residual VSV.

B. AR-XPS

The XPS spectra were obtained using a SSX-100 X-probe (Surface Science Instruments) spectrometer equipped with a monochromatized Al K α source, operated at 1486.8 eV. Survey scans were conducted, at take-off angles of 0°, 15°, 30°, 40°, 50°, 60° and 70° with the surface normal, to sample the surface at different penetration depths. During the XPS analysis, the sample charge was compensated by a 1 eV electron beam at high neutralization current by means of a Flood Gun. The pass energy was 150 V for survey scans and 50 V for high resolution scans. The pressure during analysis was kept under $2\times10^{-9}$ Torr. A 1 mm diameter beam was used in the analysis. CasaXPS software was used to calculate the nitrogen concentration. Samples were stored under vacuum overnight prior to analysis.

C. Contact Angle Measurement

Water contact angles (WCAs) were measured using a goniometer equipped with an automated dispenser (Model 500, ramé-hart instrument Co.). The WCA was measured using as liquid distilled water. Static WCAs were measured multiple times in different positions from three same samples dropping 3 μL water each.

D. Sample Preparation for ATR-FTIR

Figure 15:
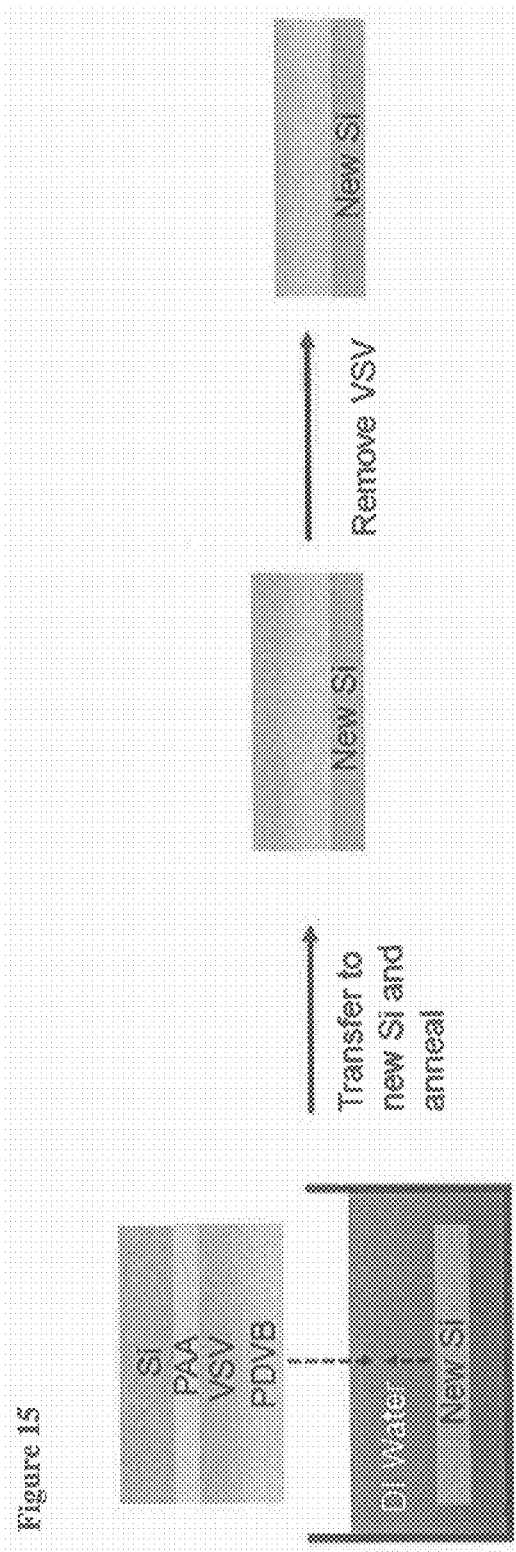
FIG. 15 shows a schematic of sample preparation for ATR-FTIR.

The 'Grafted' p(DVB) film over large area interface for Attenuated Total Reflectance Fourier Transform Infrared spectroscopy (ATR-FTIR) analysis was prepared as follows: 1) Sacrificial layer, (polyacrylic acid, PAA) was spun cast on Si wafer before forming VSV films. 2) VSV films were formed by spin-coating and then p(DVB) topcoat was deposited by iCVD. 3) Dissolving PAA in deionized water allowed the VSV/p(DVB) films to turn over and then be transferred to new Si. Annealing the films enhanced the adhesion between the films and Si. 4) To expose the interface, VSV films were dissolved by a mixture of dimethylformamide and toluene (v/v=50:50) (FIG. 15). Same washing process was used for 'p(DVB)' control sample and 'Ungrafted' p(DVB) film (FIG. 9).

E. ATR-FTIR

ATR-FTIR spectra were obtained using a Nicolet 8700 FTIR spectrometer coupled to an ATR accessary (VariGATR™, HARRICK) with a germanium crystal using OMNIC 6.2 software (Thermo Electron Corp.). The mercury cadmium telluride (MCT) detector cooled by liquid nitrogen was used. The active layer was pressed tightly against the crystal plate. Carbon dioxide and water vapor were continuously purged out during the measurements. Each spectrum represents an average of 256 scans collected in the range 700 to 4000 $cm^1$ at a resolution of 1 $cm^1$.

Example 5. Neutrality Test of iCVD p(DVB) Topcoat with PS-b-PMMA and VSV

The methyl or tert-butoxy radicals, produced by the decomposition of the initiator (e.g., tert-butyl peroxide) in the vapor phase, could activate the carbons in the aromatic rings of 2-vinylpyridine (2VP) and/or polystyrene (PS) domains by abstracting hydrogen. The resulting surface radical sites were able to react directly with the divinyl benzene (DVB) monomers. Furthermore, diffusion of monomer and initiator molecules absorbed from the vapor into block copolymer (BCP), had the potential to react at the surface and in the subsurface regions and thus, could result in strong intermolecular entanglements between BCP and initiated chemical vapor deposition (iCVD) topcoat. Eventually, through grafting and/or entanglement, the iCVD topcoat attached to the BCP, which allowed the composition to represent a nearly neutral and stable interface. Since the majority of polymer chains of a BCP film underneath the inter-diffused layer do not attach to the topcoat, they can become mobile upon thermal annealing, therefore permitting the formation of perpendicularly oriented lamellae domains. Because poly(2-vinylpyridine) (P2VP) within this diffuse interface was the reactive site for sequential infiltration synthesis (SIS), after SIS, a brief breakthrough aluminum etching of two-step etching was required to clearly develop the underlying poly(2-vinylpyridine)-block-polystyrene-block-poly(2-vinylpyridine) (VSV) patterns. The requirement of two-step etching provided additional evidence of a grafted P2VP component randomly distributed within the diffuse interface (see Example 6).

Figure 16:
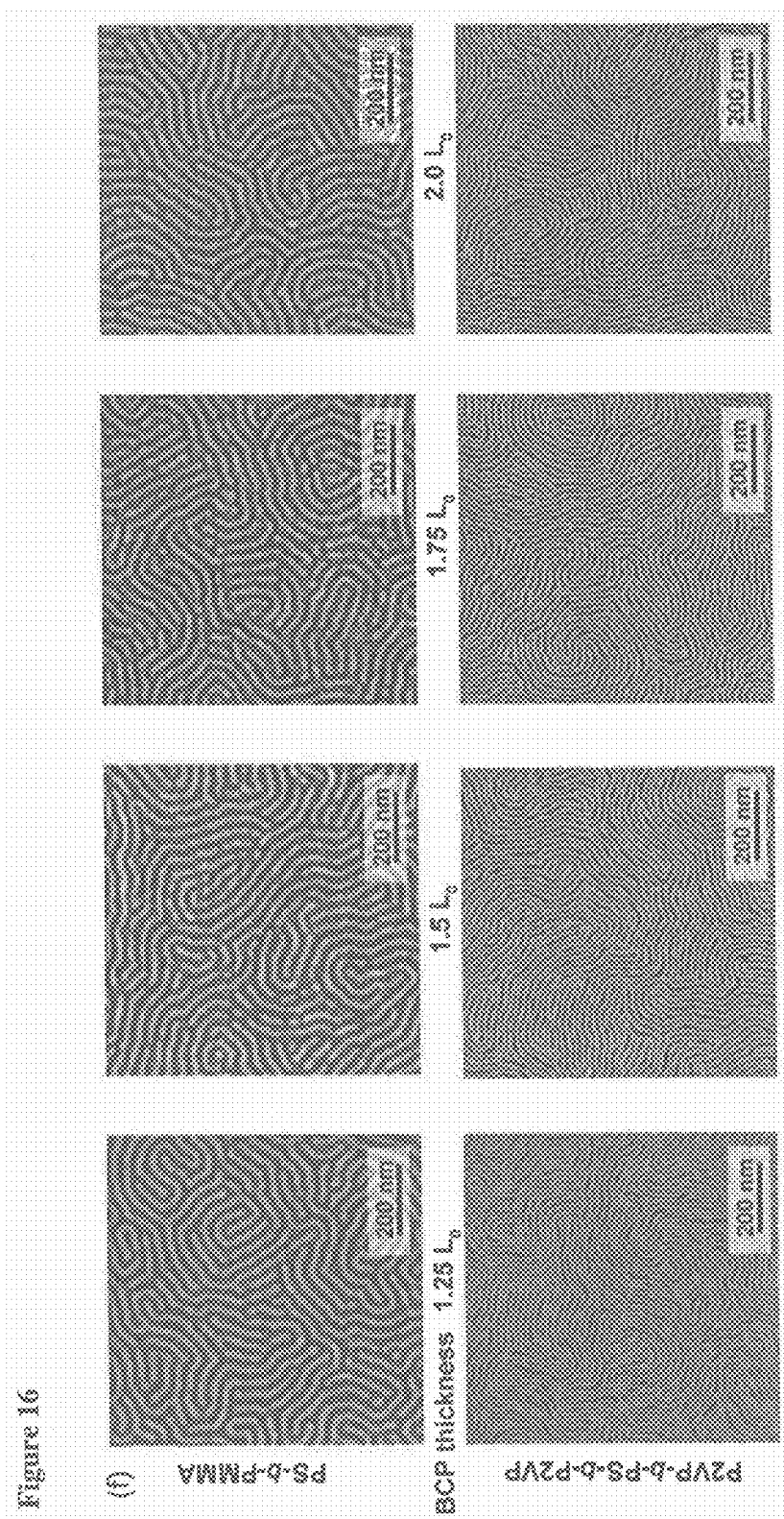
FIG. 16 shows top-down SEM images of PS-b-PMMA (top row) and P2VP-b-PS-b-P2VP (bottom row) with various film thicknesses self-assembled between neutral random copolymer brushes and iCVD p(DVB) topcoats. Perpendicular orientation is obtained for both BCP systems, regardless of film thickness.

If the mechanism for achieving the top neutral surface was grafting of BCP chains, the surface energy of the iCVD layer relative to the BCP should be unimportant. If this was indeed the mechanism, it would be a very significant finding as the iCVD p(DVB) would be an effective topcoat for other BCP compositions, irrespective of surface energy considerations. Thus, the iCVD topcoat composition would not need to change when utilizing different BCPs. It would also be anticipated that the iCVD topcoat would be compatible with BCPs for which no topcoat with a neutral wetting behavior has been identified. To verify this hypothesis of grafted BCP chains, the same iCVD p(DVB) topcoat was applied to two lamellae-forming BCPs with distinctly different surface energy characteristics, poly(styrene-block-methyl methacrylate) (PS-b-PMMA) and VSV In both cases, the BCP films with four different thicknesses in the range of 1.25 to 2.0 $L_0$ were prepared by spin coating on the neutral substrates modified by random copolymer brushes. After iCVD topcoat formation, thermal annealing, SIS, and breakthrough RIE process, as shown in SEM images of FIG. 16, the morphologies of perpendicularly oriented lamellae were observed from two BCPs regardless of the film thickness, indicating that the iCVD topcoat is neutral for both BCP systems. This result is in stark contrast to solution-applied topcoats, where a careful optimization of surface energy matching must be carried out for each BCP of interest.

The PS-r-PMMA and PS-r-P2VP brushes were spin coated on top Si wafers. The films were then annealed at 250° C. for 20 min under $N_2$ condition, and excess brush materials were washed out with solvents. On top of neutral substrates, PS-b-PMMA (37k-b-37k, Polymer Source Inc., $L_0$~40 nm) and P2VP-b-PS-b-P2VP (12k-b-23k-b-12k, Polymer Source Inc., $L_0$~21 nm) were spin coated to be 1.25, 1.5, 1.75, and 2.0 $L_0$-thick films. After iCVD topcoat, the samples were annealed at 250° C. for 8 hours under $N_2$ condition. Prior to SEM observation, all samples were treated with SIS and breakthrough RIE as described above.

Figure 17A:
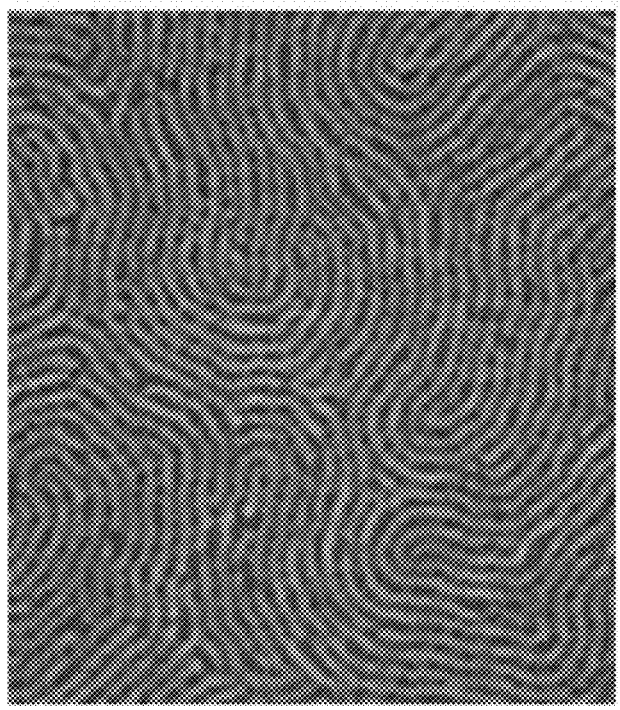
FIG. 17A shows an SEM image of a self-assembled VSV film between neutral brush and iCVD p(DVB) topcoat after SIS and RIE with single step ($O_2$ RIE).
Figure 17B:
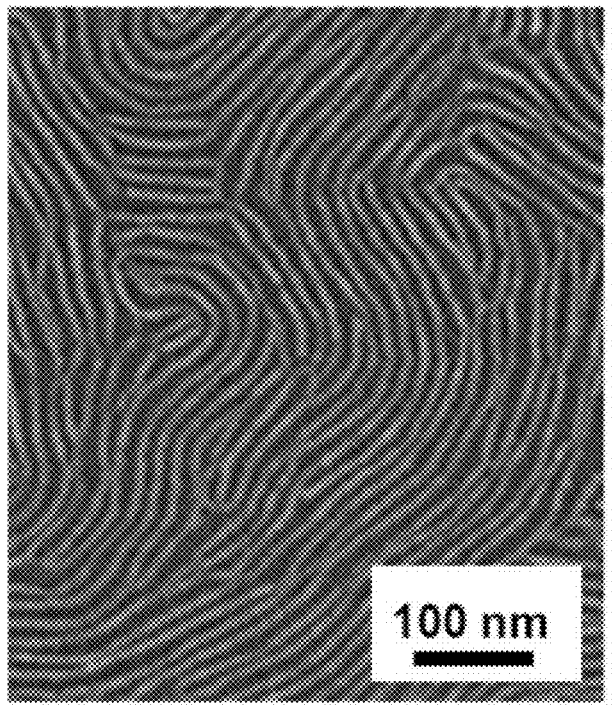
FIG. 17B shows an SEM image of a self-assembled VSV film between neutral brush and iCVD p(DVB) topcoat after SIS and RIE with two steps (breakthrough RIE+$O_2$ RIE).

Example 6. Removal of Topcoat with Single $O_2$ Reactive Ion Etching after Sequential Infiltration Synthesis After sequential infiltration synthesis (SIS) of alumina into P2VP domain, the other parts of iCVD p(DVB) topcoat/VSV must be removed to use the alumina pattern as hard mask for pattern transfer. If the bilayer is separated with a clear interface, $O_2$ reactive ion etching (RIE) should be able to remove topcoat and PS domain together because p(DVB) itself is an inert component for SIS. FIG. 17A is a SEM image after 3 cycles of SIS and $O_2$ RIE (RF power 25 W, $O_2$ 50 sccm, 80 mTorr, for 2 min) on self-assembled VSV film between neutral brush and iCVD p(DVB) topcoat. As shown in SEM image, a fingerprint pattern was observed, but the image was not clear. Moreover, the considerable amount of residue always remained at the surface even after $O_2$ RIE with enough etching time. In order to remove topcoat and PS domain clearly, breakthrough etching (RF power 50 W, ICP power 300 W, $Cl_2$ 20 sccm+$BCl_3$ 10 sccm, 7 mTorr, for 13 sec) was required prior to $O_2$ RIE (FIG. 17B).

INCORPORATION BY REFERENCE

All U.S. patents and U.S. and PCT published patent applications mentioned in the description above are incorporated by reference herein in their entirety.

EQUIVALENTS

Having now fully described the present invention in some detail by way of illustration and example for purposes of clarity of understanding, it will be obvious to one of ordinary skill clin the art that the same can be performed by modifying or changing the invention within a wide and equivalent range of conditions, formulations and other parameters without affecting the scope of the invention or any specific embodiment thereof, and that such modifications or changes are intended to be encompassed within the scope of the appended claims.

We claim:

1. A method of forming a topcoat on a block copolymer film, comprising the steps of:
    (a) providing a substrate;
    (b) forming a lithographically defined physical or chemical pattern on the substrate;
    (c) coating the substrate with the block copolymer film;
    (d) heating or irradiating an initiator, thereby producing a gaseous free radical initiator; and
    (e) contacting the block copolymer film with the gaseous free radical initiator and a gaseous monomer, thereby forming a cross-linked topcoat;
    wherein the topcoat forms an interface displaying equal preference for both components of a block copolymer; and the thickness of the topcoat is less than about 10 nm.

2. The method of claim 1, wherein the initiator is selected from the group consisting of a peroxide, an aryl ketone, and an azo compound.

3. The method of claim 1, wherein the initiator is triethylamine.

4. The method of claim 1, wherein the initiator is an aryl ketone.

5. The method of claim 1, wherein the initiator is an azo compound selected from the group consisting of 4,4'-Azobis(4-cyanovaleric acid), 4,4'-Azobis(4-cyanovaleric acid), 1,1'-Azobis(cyclohexanecarbonitrile), 2,2'-Azobis(2-methylpropionamidine) dihydrochloride, 2,2'-Azobis(2-methylpropionitrile), and 2,2'-Azobis(2-methylpropionitrile).

6. The method of claim 1, wherein the initiator is a peroxide selected from the group consisting of tert-butyl hydroperoxide, tert-butyl peracetate, cumene hydroperoxide, dicumyl peroxide, benzoyl peroxide, tert-amyl peroxide, tert-butyl peroxide, and tert-butyl peroxybenzoate.

7. The method of claim 1, wherein the monomer is at least one of an acrylate, a siloxane, a silazane, and a vinyl compound.

8. The method of claim 7, wherein the monomer is selected from the group consisting of methyl methacrylate, butyl acrylate, glycidal methacrylate, vinyl pyridine, divinylbenzene, stylene, trivinlytrimethylcyclotrisiloxane, tetravinyltetramethylcyclotetrasiloxane, trivinyltrimethylcyclotrisilazane, and tetravinyltetramethylcyclotetrasilazane.

9. The method of claim 1, wherein the substrate is selected from the group consisting of silicon wafer, glass slide, quartz, polyurethane, polyorthoester, polyacrylonitrile, polyphenazine, polytetrafluoroethylene, polyamide resin, low density polyethylene (LDPE), high density polyethylene (HDPE), expanded polytetrafluoroethylene (e-PTFE), polyimide (PI), and polypropylene (PP).

10. The method of claim 1, wherein the substrate is a silicon wafer.

11. The method of claim 1, wherein the physical or chemical pattern is formed by photolithography or electron-beam lithography.

12. The method of claim 1, wherein the block copolymer is selected from the group consisting of poly(styrene-block-methacrylate), poly(2-vinylpyridine)-block-polystyrene-block-poly(2-vinylpyridine), poly(styrene-block-ethylene oxide), and poly(styrene-block-dimethylsiloxane).

13. The method of claim 1, wherein forming the topcoat comprises initiated chemical vapor deposition (iCVD) or photoinitiated chemical vapor deposition (piCVD) of the topcoat in a deposition chamber.

14. The method of claim 1, wherein the topcoat is pinhole-free.

15. A method of forming a pattern on an article, comprising the steps of:
(a) providing an article, comprising a substrate, and a coating on the substrate, wherein the coating comprises a block copolymer film and a topcoat on the block copolymer formed by a method comprising the steps of:
  (i) providing a substrate;
  (ii) forming a lithographically defined physical or chemical pattern on the substrate;
  (iii) coating the substrate with the block copolymer film;
  (iv) heating or irradiating an initiator, thereby producing a gaseous free radical initiator;
  (v) contacting the block copolymer film with the gaseous free radical initiator and a gaseous monomer, thereby forming a cross-linked topcoat;
  wherein the topcoat forms an interface displaying equal preference for both components of a block copolymer; and the thickness of the topcoat is less than about 10 nm,
(b) coating the article with a resist;
(c) forming a resist pattern using lithography to form a mask;
(d) removing the topcoat from the masked article by a first reactive ion etching;
(e) removing the remaining polymer of the article by a second reactive ion etching; and
(f) etching the substrate by a third reactive ion etching, thereby forming the pattern on the article.

* * * * *